United States Patent
Cho et al.

(10) Patent No.: US 11,462,652 B2
(45) Date of Patent: Oct. 4, 2022

(54) SOLAR CELL AND SOLAR CELL PANEL INCLUDING THE SAME

(71) Applicant: LG ELECTRONICS INC., Seoul (KR)

(72) Inventors: Yunhui Cho, Seoul (KR); Wondoo Song, Seoul (KR); Youngjun Kim, Seoul (KR); Suchun Lee, Seoul (KR); Sungho Chang, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 15/711,530

(22) Filed: Sep. 21, 2017

(65) Prior Publication Data

US 2018/0090633 A1    Mar. 29, 2018

(30) Foreign Application Priority Data

Sep. 27, 2016  (KR) .................. 10-2016-0124236
Sep. 30, 2016  (KR) .................. 10-2016-0126000
Oct.  5, 2016  (KR) .................. 10-2016-0128103

(51) Int. Cl.
*H01L 31/05*    (2014.01)
*H01L 31/02*    (2006.01)
(Continued)

(52) U.S. Cl.
CPC .......... *H01L 31/05* (2013.01); *H01L 31/0201* (2013.01); *H01L 31/022425* (2013.01);
(Continued)

(58) Field of Classification Search
CPC ............ H01L 31/0504; H01L 31/0508; H01L 31/022433; H01L 31/022425;
(Continued)

(56) References Cited

U.S. PATENT DOCUMENTS

2012/0204928 A1    8/2012  Kutzer et al.
2014/0338719 A1*  11/2014  Kobamoto .......... H01L 31/0508
                                                          136/244
(Continued)

FOREIGN PATENT DOCUMENTS

CN    104282787 A    1/2015
CN    105261663 A    1/2016
(Continued)

OTHER PUBLICATIONS

WO 2017/002287A1 English machine translation (Year: 2017).*

*Primary Examiner* — Andrew J Golden
(74) *Attorney, Agent, or Firm* — Birch, Stewart, Kolasch & Birch, LLP

(57) ABSTRACT

Disclosed is a solar cell including a semiconductor substrate, a conductive region on or at the semiconductor substrate, and an electrode electrically connected to the conductive region. The electrode includes a plurality of finger lines formed in a first direction and parallel to each other and a bus bar electrically connected to the plurality of finger lines and formed in a second direction crossing the first direction. The bus bar includes a plurality of pad portions positioned in the second direction, and the bus bar has a plurality of regions, which are different from each other in at least one of an arrangement and an area of the plurality of pad portions, in the second direction.

9 Claims, 25 Drawing Sheets

(51) Int. Cl.
*H01L 31/0224* (2006.01)
*H01L 31/0465* (2014.01)
*H01L 31/18* (2006.01)

(52) U.S. Cl.
CPC .. *H01L 31/022433* (2013.01); *H01L 31/0465* (2014.12); *H01L 31/0504* (2013.01); *H01L 31/0508* (2013.01); *H01L 31/1868* (2013.01); *Y02E 10/50* (2013.01)

(58) Field of Classification Search
CPC . H01L 31/0201; H01L 31/05; H01L 31/1868; H01L 31/0465
See application file for complete search history.

(56) References Cited

U.S. PATENT DOCUMENTS

| | | | |
|---|---|---|---|
| 2015/0007865 A1 | 1/2015 | Steckemetz et al. | |
| 2016/0005905 A1* | 1/2016 | Jang | H01L 31/042 136/244 |
| 2016/0093752 A1* | 3/2016 | Kim | H01L 31/022425 136/244 |
| 2016/0284893 A1* | 9/2016 | Teramura | H01L 31/0465 |

FOREIGN PATENT DOCUMENTS

| | | | | | |
|---|---|---|---|---|---|
| EP | 2854181 | A1 | 4/2015 | | |
| EP | 2 966 693 | A1 | 1/2016 | | |
| JP | 57-117662 | U | 7/1982 | | |
| JP | 2002-43597 | A | 2/2002 | | |
| JP | 2011-35002 | A | 2/2011 | | |
| JP | 2011-187882 | A | 9/2011 | | |
| JP | 2013-45951 | A | 3/2013 | | |
| JP | 2014-60311 | A | 4/2014 | | |
| JP | 2014-168025 | A | 9/2014 | | |
| JP | 2015-70260 | A | 4/2015 | | |
| JP | 2015-233096 | A | 12/2015 | | |
| JP | 2016-72637 | A | 5/2016 | | |
| KR | 10-2012-0062431 | A | 6/2012 | | |
| KR | 10-2015-0035190 | A | 4/2015 | | |
| KR | 10-2016-0016304 | A | 2/2016 | | |
| KR | 20160016304 | | * | 2/2016 | |
| KR | 10-2016-0038694 | A | 4/2016 | | |
| KR | 10-2016-0038717 | A | 4/2016 | | |
| KR | 10-2016-0049414 | A | 5/2016 | | |
| WO | WO 2010/125679 | A1 | 11/2010 | | |
| WO | WO 2012/140139 | A1 | 10/2012 | | |
| WO | WO 2015/064696 | A1 | 5/2015 | | |
| WO | WO-2015064696 | A1 | * | 5/2015 | ..... H01L 31/022433 |
| WO | WO-2017002287 | A1 | * | 1/2017 | ......... H01L 31/0224 |

* cited by examiner process direction

SOLAR CELL AND SOLAR CELL PANEL INCLUDING THE SAME

CROSS-REFERENCE TO RELATED APPLICATIONS

This application claims the priority benefit of Korean Patent Application No. 10-2016-0124236 filed on Sep. 27, 2016, No. 10-2016-0126000 filed on Sep. 30, 2016, and No. 10-2016-0128103 filed on Oct. 5, 2016, in the Korean Intellectual Property Office, the disclosures of all of these applications are incorporated herein by reference in their entirety.

BACKGROUND OF THE INVENTION

Field of the Invention

Embodiments of the invention relate to a solar cell and a solar cell panel including the same, and, more particularly, to a solar cell having an improved electrode structure and a solar cell panel including the same.

Description of the Related Art

Recently, as existing energy resources such as petroleum and coal are expected to be depleted, interest in alternative energy to replace them is increasing. Among them, a solar cell that converts solar energy into electric energy is attracting attention as a next-generation battery.

A plurality of solar cells are connected in series or in parallel by a ribbon, and are then packaged through a packaging process for protecting the plurality of solar cells, thereby forming a solar cell panel. A solar cell panel requires long-term reliability because the solar cell panel generates electricity for a long time in various environments.

However, when solar cells are connected using a ribbon having a relatively large width of about 1.5 mm, a number of ribbons disposed on the solar cell should be reduced because a light loss may occur due to the relatively large width of the ribbon. On the other hand, if a number of the ribbons is increased in order to reduce a movement distance of carriers, a resistance is lowered, but an output may be largely lowered due to the shading loss. Therefore, a lead having a small width than the ribbon may be used instead of the ribbon. However, an adhesion property of the lead may be deteriorated in a specific region. If the adhesion property of the lead in the specific region is deteriorated, an output and a reliability of a solar cell panel may be deteriorated.

SUMMARY OF THE INVENTION

Therefore, embodiments of the invention have been made in view of the above problems, and the embodiments of the invention are to provide a solar cell being able to enhance an output and a reliability of a solar cell panel, and a solar cell panel including the same.

A solar cell according to an embodiment of the invention includes a semiconductor substrate, a conductive region on or at the semiconductor substrate, and an electrode electrically connected to the conductive region. The electrode includes a plurality of finger lines formed in a first direction and parallel to each other and a bus bar electrically connected to the plurality of finger lines and formed in a second direction crossing the first direction. The bus bar includes a plurality of pad portions positioned in the second direction, and the bus bar has a plurality of regions, which are different from each other in at least one of an arrangement and an area of the plurality of pad portions, in the second direction.

A solar cell according to another embodiment of the invention includes a semiconductor substrate, a conductive region on or at the semiconductor substrate, and an electrode electrically connected to the conductive region. The electrode includes a plurality of finger lines formed in a first direction and parallel to each other and a bus bar electrically connected to the finger lines and formed in a second direction crossing the first direction. The bus bar includes a line portion extending in the second direction and a plurality of pad portions spaced apart from each other in the second direction and having a width greater than a width of the line portion, and the line portion includes a main line portion having a first width and a wide portion having a width greater than the first width. The plurality of pad portions include an outer pad positioned at a portion adjacent to an end of the bus bar and a plurality of inner pads other than the outer pad. At least one of the plurality of inner pads is positioned at the main line portion and at least one of the plurality of inner pads is positioned at the wide portion.

A solar cell panel according to still another embodiment of the invention includes a plurality of solar cells including at least a first solar and a second solar cell adjacent to each other, and a plurality of leads connecting the first solar cell and the second solar cell and each having a rounded portion. Each of the plurality of solar cells includes a semiconductor substrate, a conductive region on or at the semiconductor substrate, and an electrode electrically connected to the conductive region. The electrode includes a plurality of finger lines formed in a first direction and parallel to each other and a bus bar electrically connected to the finger lines and formed in a second direction crossing the first direction. The bus bar includes a line portion extending in the second direction and a plurality of pad portions spaced apart from each other and having a width greater than a width of the line portion. The bus bar has a plurality of regions, which are different from each other in at least one of an arrangement and an area of the plurality of pad portions, in the second direction. Alternatively, the line portion includes a main line portion having a first width and a wide portion having a width greater than the first width, and at least one of the plurality of pad portions is positioned at the main line portion and at least one of the plurality of pad portions is positioned at the wide portion.

In a solar cell according to an embodiment of the invention and a solar cell panel including the same, a light loss can be minimized by using a bus bar having a small width and/or a lead having a wire shape, and a movement path of carriers can be reduced by increasing a number of bus bars and/or leads. Thus, an efficiency of the solar cell and an output of the solar cell panel can be enhanced.

According to an embodiment, the bus bar has a plurality of regions, which are different from each other in at least one of an arrangement and an area of the plurality of pad portions, and thus, an adhesion property at a region where the adhesion property of the lead may be deteriorated, thereby preventing or minimizing a deformation or a separation of the lead. Thus, an output and a reliability of the solar cell panel including the solar cell can be improved. In this instance, a deterioration of an adhesion property of the lead, which may occur at a portion adjacent to the outer pad, can be compensated by the wide portion having a wide width at a portion of the line portion adjacent to the outer pad. Thus, the lead can have a uniform and excellent adhesion property at a whole portion, and an output and a reliability of the solar cell panel including the solar cell can be improved.

According to another embodiment, by differentiating positions of first and second outer pads corresponding to or adjacent to each other on both surfaces of a solar cell, boundaries with leads can be dispersed and a thermal stress can be reduced and dispersed. Particularly, the effect of reducing and dispersing the thermal stress can be further enhanced when a large number of the leads having a small width are used as in the embodiment. Thus, a crack of the solar cell due to the thermal stress can be prevented and a reliability of a solar cell panel can be improved.

BRIEF DESCRIPTION OF THE DRAWINGS

The above and other objects, features, and other advantages of the invention will be more clearly understood from the following detailed descriptions taken in conjunction with the accompanying drawings, in which.

DETAILED DESCRIPTION OF THE EMBODIMENTS

Figure 1:
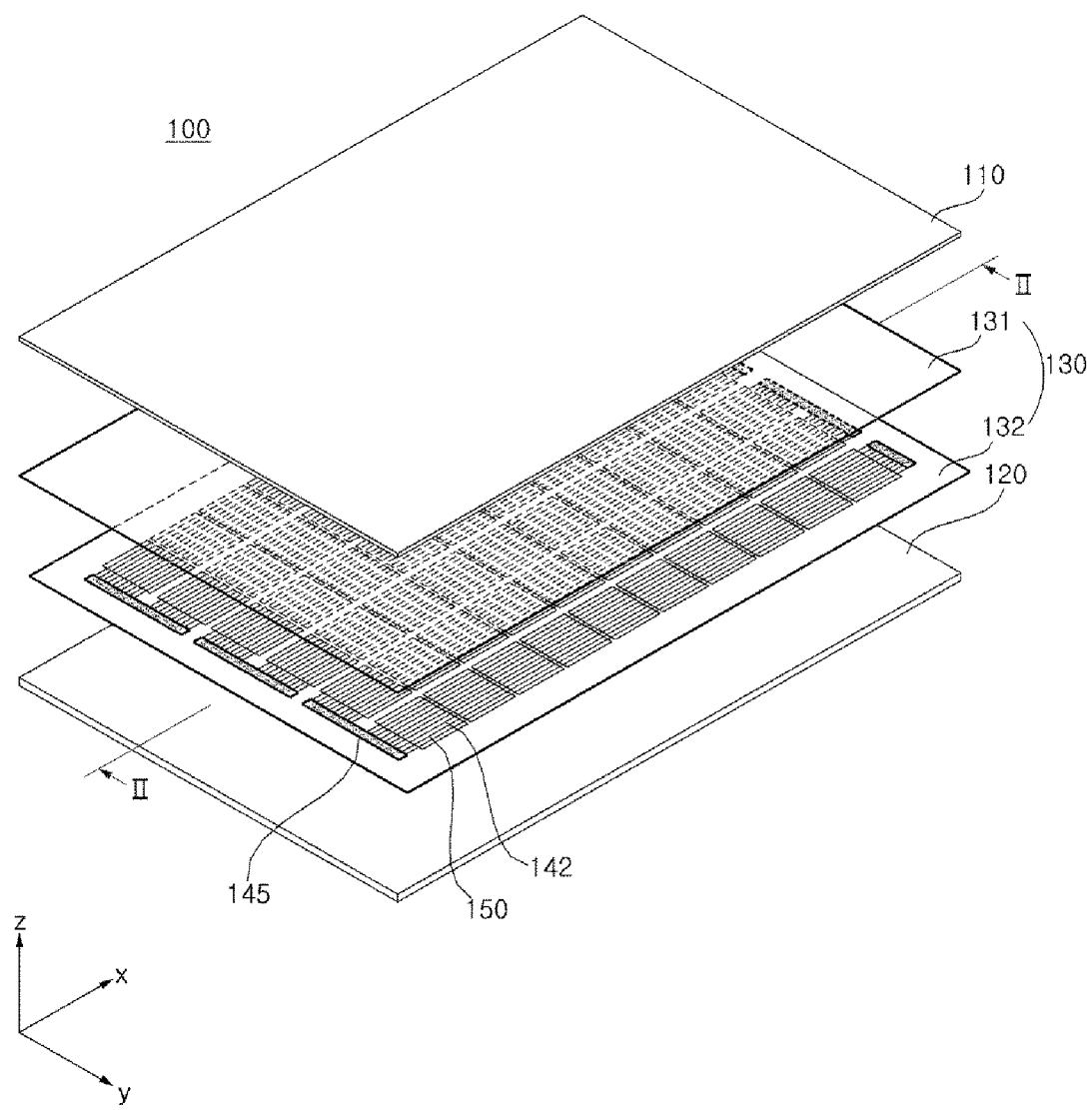
FIG. 1 is a perspective view of a solar cell panel according to an embodiment of the invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, a solar cell and a solar cell panel according to an embodiment of the invention will be described in detail with reference to the accompanying drawings. In the following descriptions, terms of "first", "second", "third," etc. are used only to distinguish one another from each other. Thus, the embodiments of the invention are not limited to the terms.

Figure 2:
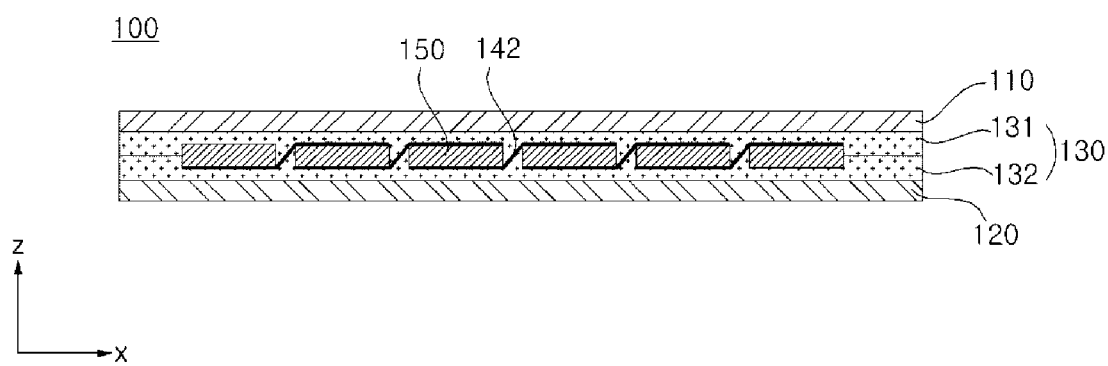
FIG. 2 is a cross-sectional view taken along line II-II in FIG. 1.

FIG. 1 is a perspective view of a solar cell panel according to an embodiment of the invention, and FIG. 2 is a cross-sectional view taken along line II-II in FIG. 1.

Referring to FIGS. 1 and 2, a solar cell panel 100 according to an embodiment includes a plurality of solar cells 150 and leads 142 electrically connecting the plurality of solar cells 150. The solar cell panel 100 may include a sealing member 130 that surrounds and seals the plurality of solar cells 150 and the leads 142 connecting the plurality of solar cells 150, a front substrate 110 positioned at a front surface of the solar cell 150 on the sealing member 130, and a back substrate 120 positioned at a back surface of the solar cell 150 on the sealing member 130. This will be described in more detail.

First, the solar cell 150 may include a photoelectric conversion unit that converts solar energy into electric energy, and an electrode electrically connected to the photoelectric conversion unit to collect and deliver current. The plurality of solar cells 150 may be electrically connected in series, parallel, or series-parallel by the lead 142. Specifically, the lead 142 electrically connects two neighboring solar cells 150 among the plurality of solar cells 150.

Bus ribbons 145 connect opposite ends of the leads 142 in solar cell strings, each of which is a column of the plurality of solar cells 150 connected through the leads 142, in an alternating manner. The bus ribbons 145 may be arranged at opposite ends of the solar cell strings, to extend in a direction crossing the solar cell strings. The bus ribbons 145 may connect adjacent ones of the solar cell strings, or connect the solar cell strings to a junction box for preventing reversal of current. A material, a shape, and a connection structure of the bus ribbons 145 may be varied and thus the embodiments of the invention are not limited thereto.

The sealing member 130 may include a first sealing member 131 disposed on the front surface of the solar cells 150 connected to each other by the leads 142, and a second sealing member 132 disposed on the back surface of the solar cells 150 connected to each other by the leads 142. The first sealing member 131 and the second sealing member 132 block a permeation of moisture or oxygen, and chemically combine elements constituting the solar cell panel 100. For the first sealing member 131 and the second sealing member 132, an insulating material having a transparent property and an adhesive property may be used. As an example, ethylene vinyl acetate (EVA) copolymer resin, polyvinyl butyral, silicone resin, ester-based resin, olefin-based resin, or the like may be used for the first sealing member 131 and the second sealing member 132. The back substrate 120, the second sealing member 132, the solar cells 150, the first sealing member 131, the front substrate 110 or so on may have an integrated structure to form the solar cell panel 100 through a lamination process using the first sealing member 131 and the second sealing member 132.

The front substrate 110 is disposed on the first sealing member 131 and constitutes a front surface of the solar cell panel 100. The back substrate 120 is disposed on the second sealing member 132 and constitutes a back surface of the solar cell panel 100. The front substrate 110 and the back substrate 120 may be made of an insulating material capable of protecting the solar cells 150 from external impact, moisture, ultraviolet, or so on. Also, the front substrate 110 may be made of an optically-transparent material that light can be transmitted through. The back substrate 120 may be a sheet made of an optically-transparent material, a non-optically-transparent material, a reflective material, or the like. For example, the front substrate 110 may be a glass substrate and the back substrate 120 may be a sheet or a film. The back substrate 120 may have a Tedlar/PET/Tedlar (TPT) type or may have a structure in which a layer of polyvinylidene fluoride (PVDF) resin or the like is formed on at least one surface of a base film (e.g., polyethylene terephthalate (PET)).

However, the embodiments of the invention are not limited thereto. Thus, the first sealing member 131 and the second sealing member 132, the front substrate 110, or the back substrate 120 may be made of any of various materials other than the above materials and may have any of various structures other than the above structures. For example, the front substrate 110 or the back substrate 120 may have various structures (e.g., a substrate, a film, a sheet, or so on) or various materials.

An example of the solar cell 150 and the leads 142 included in the solar cell panel 100 according to the embodiment of the invention will be described in more detail with reference to FIG. 3.

Figure 3:
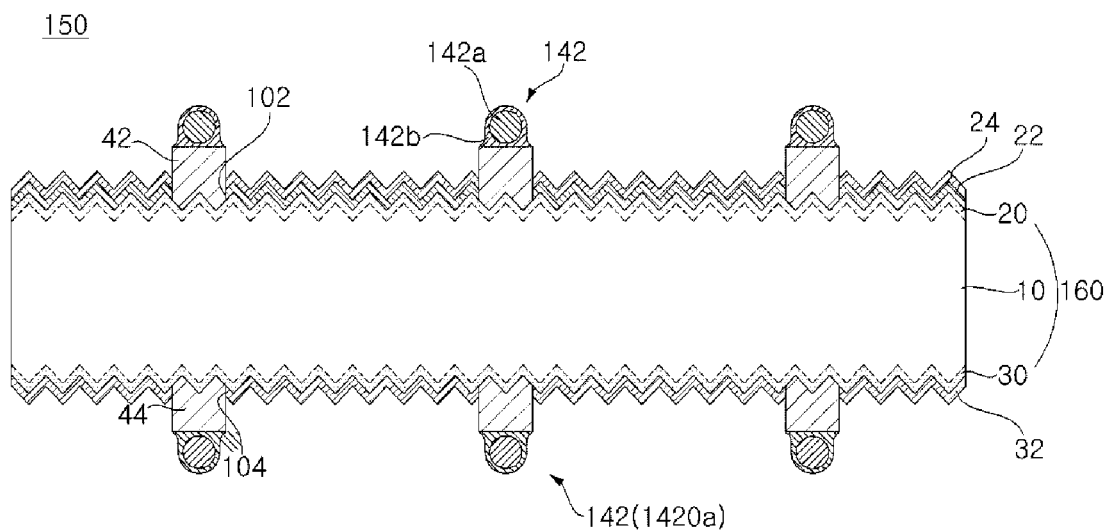
FIG. 3 is a partial cross-sectional view of an example of a solar cell and leads connected thereto, which are included in the solar cell panel shown in FIG. 1.

FIG. 3 is a partial cross-sectional view of an example of the solar cell 150 and the leads 142 connected thereto, which are included in the solar cell panel 100 shown in FIG. 1.

Referring to FIG. 3, the solar cell 150 may include a semiconductor substrate 160, a conductive region 20 or 30 formed on or formed at the semiconductor substrate 160, and an electrode 42 or 44 connected to the conductive region 20 or 30. The conductive region 20 or 30 may include a first conductive region 20 having a first conductivity type and a second conductive region 30 having a second conductivity type. The electrode 42 or 44 may include a first electrode 42 connected to the first conductive region 20 and a second electrode 44 connected to the second conductive region 30. Also, the solar cell 150 may further include first and second passivation layers 22 and 32, an anti-reflection layer 24, and the like.

The semiconductor substrate 160 may include a base region 110 having a first or second conductivity type. The base region 110 includes a first or second conductivity type dopant with a relatively low doping concentration. As an example, the base region 110 may have a second conductivity type. The base region 110 may be comprised of a single crystalline semiconductor (e.g., a single-crystalline or polycrystalline semiconductor of a single material, e.g., single-crystalline or polycrystalline silicon, particularly, single-crystalline silicon) including a first or second conductivity type dopant. The solar cell 150 based on the base region 110 or the semiconductor substrate 160 having a high degree of crystallinity and having few defects is excellent in electrical characteristics.

An anti-reflection structure capable of minimizing reflection may be formed at a front surface and a back surface of the semiconductor substrate 160. For example, a texturing structure having a concavo-convex shape in a form of a pyramid or the like may be provided as the anti-reflection structure. The texturing structure formed at the semiconductor substrate 160 may have a certain shape (e.g., a pyramid shape) having an outer surface formed along a specific crystal plane (e.g., (111) plane) of a semiconductor. When the surface roughness of the semiconductor substrate 160 is increased due to the unevenness formed at the front surface of the semiconductor substrate 160 by a texturing, the reflectance of the light incident into the semiconductor substrate 160 can be reduced and thus an optical loss can be minimized. However, the embodiments of the invention are not limited thereto, and the texturing structure may be formed at only one surface of the semiconductor substrate 160, or the texturing structure may not be formed at the front and back surfaces of the semiconductor substrate 160.

The first conductive region 20 having the first conductivity type may be formed at one surface (e.g., the front surface) of the semiconductor substrate 160. The second conductive region 30 having the second conductivity type may be formed at the other surface (e.g., the back surface) of the semiconductor substrate 160. The first or second conductive region 20 or 30 may have a different conductivity type than the base region 110 or may have a higher doping concentration than the base region 110 in an instance that the first or second conductive region 20 or 30 has the conductivity type the same as the conductivity type of the base region 110.

In the drawing, the first and second conductive regions 20 and 30 are constituted by a doped region constituting a part of the semiconductor substrate 160 as an example. In this instance, the first conductive region 20 may be formed of a crystalline semiconductor (e.g., a single-crystalline or polycrystalline semiconductor, for example, a single-crystalline or polycrystalline silicon, particularly, a single-crystalline silicon) including the first conductive type dopant. The second conductive region 30 may be formed of a crystalline semiconductor (e.g., a single-crystalline or polycrystalline semiconductor, for example, a single-crystalline or polycrystalline silicon, particularly, a single-crystalline silicon) including the second conductivity type dopant. As described above, when the first and second conductive regions 20 and 30 constitute a part of the semiconductor substrate 160, the junction characteristics with the base region 110 can be improved.

However, the embodiments of the invention are not limited thereto, and at least one of the first and second conductive regions 20 and 30 may be formed separately from the semiconductor substrate 160 on the semiconductor substrate 160. In this instance, the first or second conductive regions 20 or 30 may be formed of a semiconductor layer (e.g., an amorphous semiconductor layer, a micro-crystalline semiconductor layer, or a polycrystalline semiconductor layer, for example, an amorphous silicon layer, a micro-crystalline silicon layer, or a polycrystalline silicon layer) having a crystal structure different from that of the semiconductor substrate 160 so that the first or second conductive regions 20 or 30 can be easily formed on the semiconductor substrate 160.

One of the first and second conductive regions 20 and 30, which has a conductivity type different from that of the base region 110, constitutes at least a part of the emitter region. The emitter region forms a pn junction with the base region 110 to produce carriers by a photoelectric conversion. The other of the first and second conductive regions 20 and 30 having the same conductivity type as the base region 110 constitutes at least a part of a surface field region. The surface field region forms an electric field that prevents or reduces carriers from being lost by a recombination on a surface of the semiconductor substrate 160. For example, in the embodiment, the base region 110 has the second conductivity type, the first conductive region 20 constitutes the emitter region, and the second conductive region 30 constitutes a back surface field region. However, the embodiments of the invention are not limited thereto.

In the drawings, each of the first and second conductive regions 20 and 30 is formed at an entire portion in a plan view and has a homogeneous structure having a uniform doping concentration. In this instance, the first and second conductive regions 20 and 30 can be formed to have a sufficient area and can be manufactured by a simple process. However, the embodiments of the invention are not limited thereto. Thus, the first conductive region 20 may have the homogeneous structure or a selective structure, and the second conductive region 30 may have the homogeneous structure, a selective structure, or a local structure. In the selective structure, a portion of the first or second conductive region 20 or 30 adjacent to the first or second electrode 42 or 44 has a high doping concentration, a large junction depth, and/or a low resistance, and the other portion of the first or second conductive region 20 or 30 has a low doping concentration, a small junction depth, and/or a high resistance. In the local structure, the second conductive region 30 may be formed locally only at a portion where the second electrode 44 is located.

For example, in the embodiment, the base region 110 and the second conductive region 30 may have an n-type and the first conductive region 20 may have a p-type. Then, the base region 110 and the first conductive region 20 form a pn junction. When light is incident to the pn junction, electrons generated by the photoelectric effect move toward the back surface of the semiconductor substrate 160 and are collected by the second electrode 44, and the holes move toward the front surface of the semiconductor substrate 160 and collected by the first electrode 42. Thereby, electric energy is generated. Then, the holes having a low moving speed than electrons may move to the front surface of the semiconductor substrate 160 not the back surface thereof, thereby improving the efficiency. However, the embodiments of the invention are not limited thereto. Thus, the base region 110 and the second conductive region 30 may have a p-type and the first conductive region 20 may have an n-type.

An insulating layer such as first and second passivation layers 22 and 32 and an anti-reflection layer 24 may be formed on the surface of the semiconductor substrate 160. More specifically, a first passivation layer 22 may be formed on (e.g., be in contact with) the front surface of the semiconductor substrate 160, more particularly, on the first conductive region 20 formed at the semiconductor substrate 160. The anti-reflection layer 24 may be formed on (e.g., be in contact with) the first passivation layer 22. The second passivation layer 32 may be formed on the back surface of the semiconductor substrate 160, more particularly, on the second conductive region 30 formed at the semiconductor substrate 160.

The first passivation layer 22 and the anti-reflection layer 24 may be formed on a substantially entire portion of the front surface of the semiconductor substrate 160 except for a portion corresponding to the first electrode 42 (more particularly, a portion where a first opening portion 102 is formed). Similarly, the second passivation layer 32 may be formed on a substantially entire portion of the back surface of the semiconductor substrate 160 except for a portion corresponding to the second electrode 44 (more particularly, a portion where a second opening 104 is formed).

The first passivation layer 22 or the second passivation layer 32 may be in contact with the semiconductor substrate 160 to passivate defects existing in a surface or a bulk of the semiconductor substrate 160. Accordingly, an open-circuit voltage of the solar cell 150 can be increased by removing recombination sites of minority carriers. The anti-reflection layer 24 reduces a reflectance of light incident to the front surface of the semiconductor substrate 160, thereby increasing the amount of light reaching the pn junction. Accordingly, a short circuit current Isc of the solar cell 150 can be increased.

The first passivation layer 22, the anti-reflection layer 24, and the second passivation layer 32 may be formed of any of various materials. For example, the first passivation layer 22, the anti-reflection layer 24, or the second passivation layer 32 may be formed of a single layer including one layer selected from a group consisting of a silicon nitride layer, a silicon nitride layer containing hydrogen, a silicon oxide layer, a silicon oxynitride layer, an aluminum oxide layer, a silicon carbide layer, MgF2, ZnS, TiO2 and CeO2, or a multilayer in which two or more layers selected from the above group are combined.

For example, in the embodiment, the first passivation layer 22 and/or the anti-reflection layer 24, and the second passivation layer 32 may not have a dopant or the like so as to have good insulating properties, passivation properties, and the like. However, the embodiments of the invention are not limited thereto.

The first electrode 42 may be formed by filling at least a portion of the first opening 102 and be electrically connected to (e.g., be in contact with) the first conductive region 20. The second electrode 44 may be formed by filling at least a portion of the second opening 104 and be electrically connected to (e.g., be in contact with) the second conductive region 30. The first and second electrodes 42 and 44 are made of any of various conductive materials (e.g., a metal) and may have any of various shapes. Shapes of the first and second electrodes 42 and 44 will be described later.

In the embodiment, the first and second electrodes 42 and 44 of the solar cell 150 have a predetermined pattern so that the solar cell 150 can receive light from the front and back surfaces of the semiconductor substrate 160, and thus, the solar cell 150 has a bi-facial structure. Accordingly, the amount of light used in the solar cell 150 can be increased and thus it contributes to improving an efficiency of the solar cell 150.

However, the embodiments of the invention are not limited thereto, and the second electrode 44 may be formed entirely on the back surface of the semiconductor substrate 160. The first and second conductive regions 20 and 30 and the first and second electrodes 42 and 44 may be located together on one surface (e.g., the back surface) of the semiconductor substrate 160. Also, at least one of the first and second conductive regions 20 and 30 may be formed on both surfaces of the semiconductor substrate 160. That is, the solar cell 150 described in the above is merely one example, but the embodiments of the invention are not limited thereto.

The solar cell 150 described above is electrically connected to a neighboring solar cell 150 by leads 142 positioned on (e.g., in contact with) the first electrode 42 or the second electrode 44. This will be described in more detail with reference to FIG. 4 together with FIGS. 1 to 3.

Figure 4:
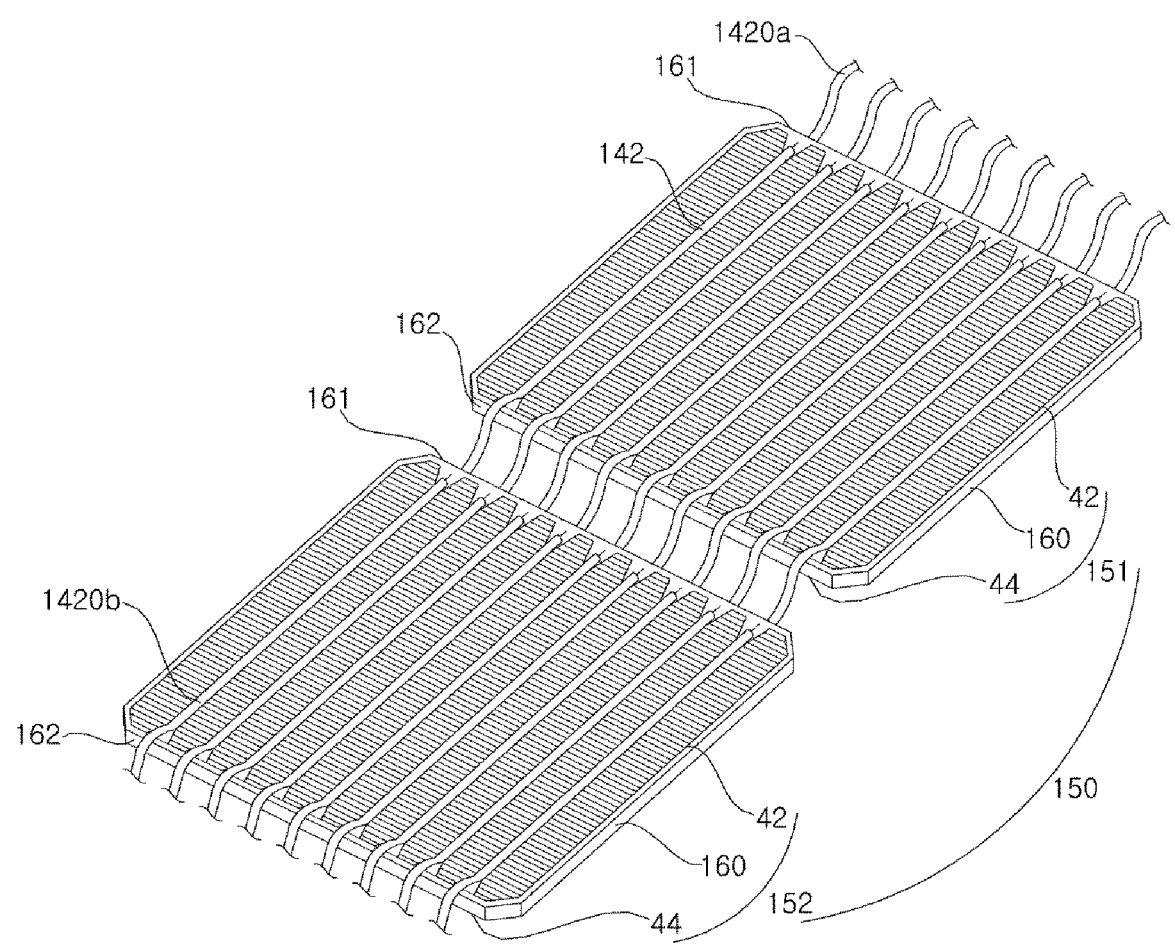
FIG. 4 is a perspective view schematically showing a first solar cell and a second solar cell connected by the leads, which are included in the solar cell panel shown in FIG. 1.

FIG. 4 is a perspective view schematically showing a first solar cell 151 and a second solar cell 152 connected by the leads 142, which are included in the solar cell panel 100 shown in FIG. 1. The semiconductor substrate 160 and the electrodes 42 and 44 of the first and second solar cells 151 and 152 are schematically shown only in FIG. 4 for simplicity and clarity.

As shown in FIG. 4, two solar cells 150 (e.g., the first solar cell 151 and the second solar cell 152) adjacent to each other among the plurality of solar cells 150 are connected by the lead 142. In this instance, the lead 142 electrically connects the first electrode 42 on a front surface of the first solar cell 151 and the second electrode 44 on a back surface of the second solar cell 152 positioned on one side (a left and lower side in FIG. 4) of the first solar cell 151. Another lead 1420a electrically connects the second electrode 44 on the back surface of the first solar cell 151 and the first electrode 42 on the front side of another solar cell, which will be positioned on the other side (a right and upper side in FIG. 4) of the first solar cell 151. Still another lead 1420b electrically connects the first electrode 42 on the front surface of the second solar cell 152 and the second electrode 44 on the back surface of still another second solar cell, which will be positioned on one side (a left and lower side in FIG. 4) of the second solar cell 152. Accordingly, the plurality of solar cells 150 can be connected to each other by the leads 142, 1420a, and 1420b. The descriptions of the lead 142 can be applied to the leads 142, 1420a, and 1420b that connect the two adjacent solar cells 150 to each other.

In this embodiment, each lead 142 may include a first portion connected to the first electrode 42 of the first solar cell 151 (in more detail, a bus bar 42b of the first electrode 42) at the front surface of the first solar cell 151 while extending from a first side (or a first edge) 161 of the first solar cell 151 toward a second side (or a second edge) 162 of the first solar cell 151 opposite the first side 161, a second portion connected to the second electrode 44 of the second solar cell 152 (in more detail, a bus bar of the second electrode 44) at the back surface of the second solar cell 152 while extending from the second side 162 of the second solar cell 152 toward the first side 161 of the second solar cell 152 opposite the second side 162 of the second solar cell 152, and a third portion extending from the front surface of the first solar cell 151 to the back surface of the second solar cell 152, to connect the first portion and second portion. Accordingly, the lead 142 may be arranged to extend across the first solar cell 151 along a portion of the first solar cell 151, and then, to extend across the second solar cell 152 along a portion of the second solar cell 152. Since the lead 142 is formed only in regions corresponding to portions of the first and second solar cells 151 and 152 (e.g., the bus bar 42b) while having a smaller width than the first and second solar cells 151 and 152, the lead 142 may effectively connect the first and second solar cells 151 and 152 in spite of the small area thereof.

For example, the lead 142 may be arranged at the corresponding first and second electrodes 42 and 44 of the first and second solar cells 151 and 152, to extend longitudinally along the bus bar 42b of the first and second electrodes 42 and 44 while contacting the bus bar 42b. Accordingly, the lead 142 continuously contacts the first and second electrodes 42 and 44 and, as such, an electrical connection property can be enhanced.

With reference to one surface of each solar cell 150, a plurality of leads 142 are provided and, as such, an electrical connection property of the solar cells 150 can be enhanced. In particular, in the embodiment, each lead 142 is constituted by a wire having a smaller width than a ribbon having a relatively great width (e.g., 1 to 2 mm), which has been used in conventional arts. To this end, a number of leads 142 (e.g., two to five) greater than a number of ribbons as described above is used with respect to one surface of each solar cell 150.

In one example, each lead 142 includes a core layer 142a, and a solder layer 142b coated on an outer surface of the core layer 142a with a small thickness. The solder layer 142b may include a solder material for soldering the lead 142 and the electrodes 42 and 44. For example, the core layer 142a may include a material (e.g., a metal, in more detail, Ni, Cu, Ag, or Al) exhibiting excellent electrical conductivity as a major material thereof (e.g., a material having a content of 50 wt % or more, in more detail, a material having a content of 90 wt % or more). The solder layer 142b may include a material such as Pb, Sn, SnIn, SnBi, SnPb, SnPbAg, SnCuAg or SnCu as a major material thereof. However, the embodiments of the invention are not limited to the above-described materials, and thus, the core layer 142a and the solder layer 142b may include any of various materials.

When the wire, which has a smaller width than the conventional ribbon, is used as the lead 142, material costs may be greatly reduced. Since the lead 142 having a smaller width than the ribbon are provided by a sufficient number, as such, a movement distance of carriers can be minimized. Accordingly, an output power of the solar cell panel 100 can be enhanced.

Also, a wire constituting the lead 142 in accordance with the embodiment may have a rounded portion. That is, the wire constituting the lead 142 may have a circular or oval cross-section, a curved cross-section, or a rounded cross-section, to induce reflection or diffuse reflection. Accordingly, the light reflected from a rounded surface of the wire constituting the lead 142 may be reflected or totally reflected upon the front substrate 110 or back substrate 120 disposed at the front surface or the back surface of the solar cell 150 and, as such, may be again incident upon the solar cell 150. Thus, an output power of the solar cell panel 100 can be effectively enhanced. However, the embodiments of the invention are not limited thereto, and thus, the wire constituting the lead 142 may have a quadrangular shape or a polygonal shape. The wire may also have any of various other shapes.

In this embodiment, the lead 142 may have a width (or a diameter) of 1 mm (i.e. 250 to 500 µm) or less. For reference, in the embodiment, a thickness of the solder layer 142b is very small and is varied depending on a position of the lead 142, and thus, the width of the lead 142 may be a width of the core layer 142a. On the other hand, the width of the lead 142 may be a width of a portion of the lead 142 on the line portion 421 (see FIG. 5) measured in a position passing through a center of the lead 142. By the lead 142, which has the wire shape while having the small width, the current generated in the solar cell 150 can be effectively transferred to an outer circuit (e.g., a bus ribbon or a bypass diode of a junction box) or to another solar cell 150. In the embodiment, the lead 142 may be fixed to the electrode 42 or 44 of the solar cell 150 in the state that each lead 142 is independently disposed on and fixed to the electrode 42 or 44, and thus, the leads 142 are not inserted into a separate layer, film, or the like to be fixed to the electrodes 42 and 44. If the width of the lead 142 is less than 250 µm, a strength of the lead 142 may be insufficient, and the lead 142 may exhibit an inferior electrical connection property and a low attachment force because an connection area or an attachment area between the lead 142 and the electrode 42 or 44 is too small. On the other hand, if the width W1 of the lead 142 is greater than 1 mm (e.g., 500 µm), a material cost of the lead 142 may increase, and the lead 142 may obstruct incident light upon the front surface of the solar cell 150, and thus, a shading loss may increase. In addition, a force applied to the lead 142 in a direction away from the electrode 42 or 44 may increase and, as such, an attachment force between the lead 142 and the electrode 42 or 44 may be reduced. In severe instances, a crack or the like may be generated at the electrode 42 or 44 or the semiconductor substrate 160. For example, the width W1 of the lead 142 may be in a range of 350 to 450 µm (in particular, 350 to 400 µm). In this range, an output power of the solar cell panel 100 can be enhanced while an attachment force to the electrode 42 or 44 can be increased.

In the embodiment, a number of the leads 142 (or a number of the bus bars 42b corresponding to the leads 142 one-to-one) may be six to thirty-three based on one surface of the semiconductor substrate 160. In order to enhance an output of the solar cell panel more, the number of the bus bars 42b or the leads 142 may be ten or more (e.g., twelve to twenty-four). However, the embodiments of the invention are not limited thereto, and the number of the leads 142 and the number of the bus bars 42b may have any of different values.

An example of the electrodes 42 and 44 of the solar cell 150 according to the embodiment of the invention where the leads 142 are attached will be described in more detail with reference to FIG. 5 together with FIGS. 1 to 4. Hereinafter, although an illustration and a description are given in conjunction with the first electrode 42 with reference to FIG. 5, the illustration and the description may be applied to one of the first electrode 42 and the second electrode 44. Then, the other of the first electrode 42 and the second electrode 44 may be the same as the electrode, which will be described in the below. Alternatively, the other of the first electrode 42 and the second electrode 44 may have the same or similar shape with the electrode, which will be described in the below, but an area, an interval, a pitch, or so of the other of the first electrode 42 and the second electrode 44 may be different from the electrode, which will be described in the below. Also, the other of the first electrode 42 and the second electrode 44 may be totally different from the electrode, which will be described in the below.

Figure 5:
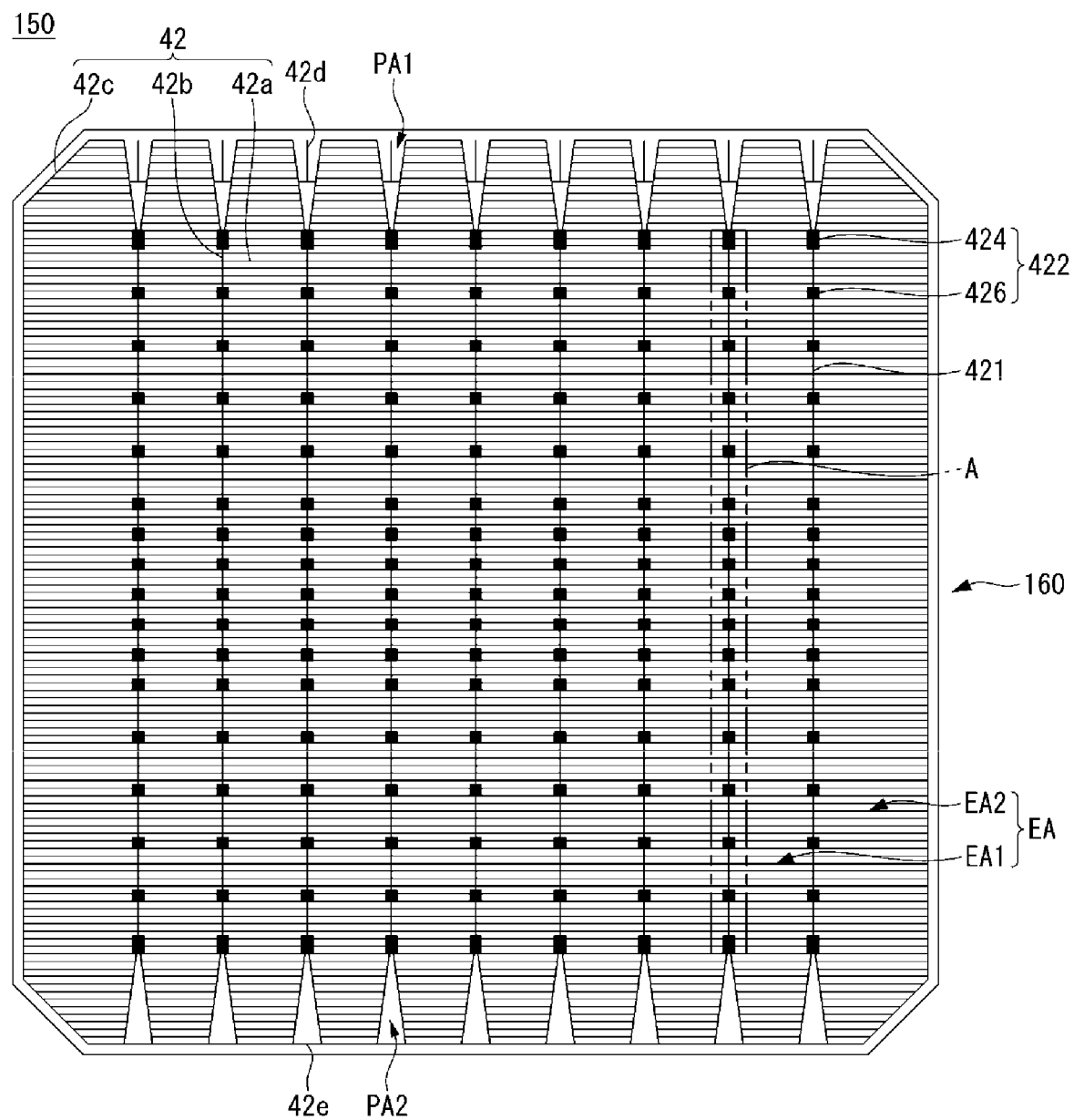
FIG. 5 is a front plan view of a solar cell shown in FIG. 4.

FIG. 5 is a front plan view of the solar cell 100 shown in FIG. 4.

With reference to FIGS. 1 to 5, in the embodiment, the first electrode 42 includes a plurality of finger lines 42a extended in a first direction (a horizontal direction in the drawings) and spaced apart from one another and bus bars 42b formed in a second direction crossing (for example, perpendicular to) the finger lines 42a to electrically connected to the finger lines 42a. The leads 142 are connected or attached to the bus bars 42b. It is exemplified that the first electrode 42 further include edge lines 42c connect ends of finger lines 42a adjacent to two opposite sides or edges in the drawings. A width of the edge line 42c may be the same as or similar to the width of finger lines 42a and the edge line 42c may formed of a material the same as that of the finger lines 42a. However, the edge lines 42c may be omitted.

In this instance, the solar cell 150 (or the semiconductor substrate 160) may be divided into an electrode area EA and a peripheral area PA. In this instance, the electrode area EA may be an area where the finger lines 42a, which extend in parallel, are arranged at a uniform pitch P. The electrode area EA may include a plurality of electrode areas divided by leads 142. the peripheral area PA may be an area defined between two adjacent ones of the electrode areas EAs while being arranged adjacent to a corresponding one of the edges of the semiconductor substrate 160 or the solar cell 150 at an outside of a plurality of pad portions 422 (more particularly, at an outside of outer pads 424). In this instance, the peripheral area PA may be an area where electrode portions 42d and 42e are arranged in a lower density than that of the finger lines 42a in the electrode area EA or an area where no electrode portions 42d and 42e are arranged.

The electrode area EA may include a plurality of electrode areas EA divided with reference to the bus bar 42b or the leads 142. For example, the electrode area EA may include a first electrode area EA1 defined between two neighboring bus bar 42b or leads 142, and two second electrode areas EA2 each defined between two sides (or two edges) of the solar cell 150 and the lead 142.

It is exemplified that a width of the first electrode area EA1 is smaller than a width of the second electrode area EA2 in the drawing. Then, when a lot of leads 142 or bus bars 42b are provided, it may be possible to prevent the bus bars 42b or the leads 142 from being disposed at a corner portion (for example, an inclined portion) of the semiconductor substrate 160. Thereby, a damage of the leads 142 can be minimized and a path of carriers can be optimized. However, the embodiments of the invention are not limited thereto. Thus, a width of the first electrode area EA1 may be the same as or greater than a width of the second electrode area EA2. Also, other modifications are possible.

In this instance, the peripheral area PA may include a first peripheral area PA1 and a second peripheral area PA2. The first peripheral area PA1 is arranged at one end of the bus bar 42b where the lead 142 is positioned, whereas the second peripheral area PA2 is arranged at the other end of the bus bar 42b where the lead 142 is extended to be connected to another solar cell 150 or an outer circuit.

In the embodiment, the electrode portions 42d and 42e are respectively disposed at the first and second peripheral areas PA1 and PA2, and thus, the leads 142 overlap with, and are in contact with or are electrically connected to the electrode portions 42d and 42e. Then, the current generated in the electrode area EA adjacent to the first and second peripheral areas PA1 and PA2 may be transferred to the corresponding lead 142. Accordingly, even when the first and second peripheral areas PA1 and PA2 are provided to achieve an enhancement in a bonding force or coupling force of the leads 142, it may be possible to avoid an efficiency reduction that may be caused, by the first and second peripheral areas PA1 and PA2. Thus, an efficiency of the solar cell 150 may be enhanced and, as such, an output power of the solar cell panel 100 may be enhanced.

In this instance, the electrode portion 42d disposed at the first peripheral area PA1 and the electrode portion 42e disposed at the second peripheral area PA2 are configured to have different shapes. More particularly, the electrode portion 42d disposed at the first peripheral area PA1 may include a first electrode part disposed inwards of the outermost finger line 42a, and a second electrode part extending from the first electrode part to a position flush with the outermost finger line 42a or a position outwards of the outermost finger line 42a in a direction crossing (for example, perpendicular to) the first electrode part. The electrode portion 42e disposed at the second peripheral area PA2 may include a third electrode part disposed at a position flush with the corresponding outermost finger line 42a or a position outwards of the outermost finger line 42a. In this instance, the third electrode part may be formed to be parallel to the finger lines 42a. Thereby, a coupling force of the lead 142 at the first peripheral area PA1 can be enhanced, and a carrier flow can be enhanced by a simple structure at the second peripheral area PA2 where the lead 142 extends. Thus, the lead 142 and the electrode portions 42d and 42e can be stably connected to each other, even the structure of the lead 142 at the first peripheral area PA1 is different from the structure of the lead 142 at the second peripheral area PA2. However, the embodiments of the invention are not limited thereto. Thus, the electrode portion 42d disposed at the first peripheral area PA1 and the electrode portion 42e disposed at the second peripheral area PA2 are configured to have the same shape or the symmetrical shapes.

The plurality of finger lines 42a may be spaced apart from one another while having a uniform width and a uniform pitch. It is exemplified that the finger lines 42a are parallel to each other and extend in a first direction while being parallel to the main sides (or edges) of the solar cell 150 (for example, the first and second sides 161 and 162) in the drawing. However, the embodiments of the invention are not limited to the above.

In this instance, a width of the leads 142 may be smaller than a pitch of the finger lines 42a and may be greater than widths of the finger lines 42a. However, the embodiments of the invention are not limited to the above, and various modifications are possible.

As described above, each bus bar 42b may be disposed to correspond to a region where each lead 142 is disposed to connect neighboring solar cells 150. The bus bar 42b may be provided to correspond to the leads 142 one to one. In this embodiment, accordingly, the bus bars 42b are the same in number to the leads 142 with reference to one surface of the solar cell 150.

In the embodiment, the bus bar 42b may include a plurality of pad portions 422 positioned in the second direction to correspond to the respective lead 142. The bus bar 42b may further include a line portion 421 having a width smaller than a width of the pad portion 422 and longitudinally extending in a direction that the lead 142 is connected between the pad portions 422.

The pad portion 422 is a region having a relatively large width, and thus, the lead 142 is substantially attached and fixed to the pad portion 422. A width of the pad portion 422 measured in the first direction is larger than each of a width of the line portion 421 in the first direction and a width of the finger line 42a in the second direction, and may be the same as or greater than a width of the lead 142. A length of the pad portion 422 measured in the second direction may be also greater than the width of the finger line 42a. By the pad portion 422, the adhesion force between the lead 142 and the bus bar 42b can be improved and the contact resistance between the lead 142 and the bus bar 42b can be reduced.

The line portion 421 connects the plurality of finger lines 42a and the pad portions 422 to provide a path through which carriers can bypass when some finger lines 42a are disconnected. A width of the line portion 421 measured in the first direction may be smaller than widths of the pad portion 422 and the lead 142 in the first direction and may be smaller than, the same as, or greater than the width of the finger line 42a measured in the second direction. For example, the width of the line portion 421 may be 0.5 to 2 times the width of the finger line 42a. When the line portion 421 has a relatively small width, an area of the first electrode 42 can be minimized and thus a shading loss and a material cost can be reduced. The lead 142 may be attached to the line portion 421 or the lead 142 may be placed on the line portion 421 in the state that the lead 142 is not attached to the line portion 421.

In this instance, the plurality of pad portions 422 include outer pads 424 located at portions adjacent to both sides (or opposite sides or opposite ends) of the bus bar 42b in the second direction, and inner pads 426 other than the outer pads 424. More particularly, the outer pads 424 are two pads, which are closest to two opposite sides of the solar cell 150 (or the semiconductor substrate 160) in the second direction, respectively, among the plurality of pad portions 422. The inner pad 426 may be a pad located between the two outer pads 424. In this instance, whether the outer pad 424 or the inner pad 426 is determined only with reference to the plurality of pad portions 422, and thus, the line portion 421 may be positioned outside the outer pad 424, which is different from the drawings.

For example, a length of the outer pad 424 in the second direction may be greater than a length of the inner pad 426. That is, an attachment area between the lead 142 and the outer pad 424 is greater than an attachment area between the lead 142 and the inner pad 426, considering the attachment property between the lead 142 and the outer pad 424 may be lower than the attachment property between the lead 142 and the inner pad 426. However, the embodiments of the invention are not limited to the above.

In the embodiment, the bus bar 42b corresponding each of the lead 142 has a plurality of regions, which are different from each other in at least one of an arrangement and an area of the plurality of pad portions 422, in the second direction. More particularly, the bus bar 42b has the plurality of regions, which are different from each other in at least one of an arrangement and an area of the plurality of inner pads 426. That is, the bus bar 42b may has at least a first region A1 and a second region A2, which are different from each other in the at least one of the arrangement and the area of the plurality of pad portions 422 (more particularly, the plurality of inner pads 426). This is to prevent a deterioration of an adhesion property of the lead 142 in a specific region of the solar cell 150, which will be described later in more detail.

Figure 6:
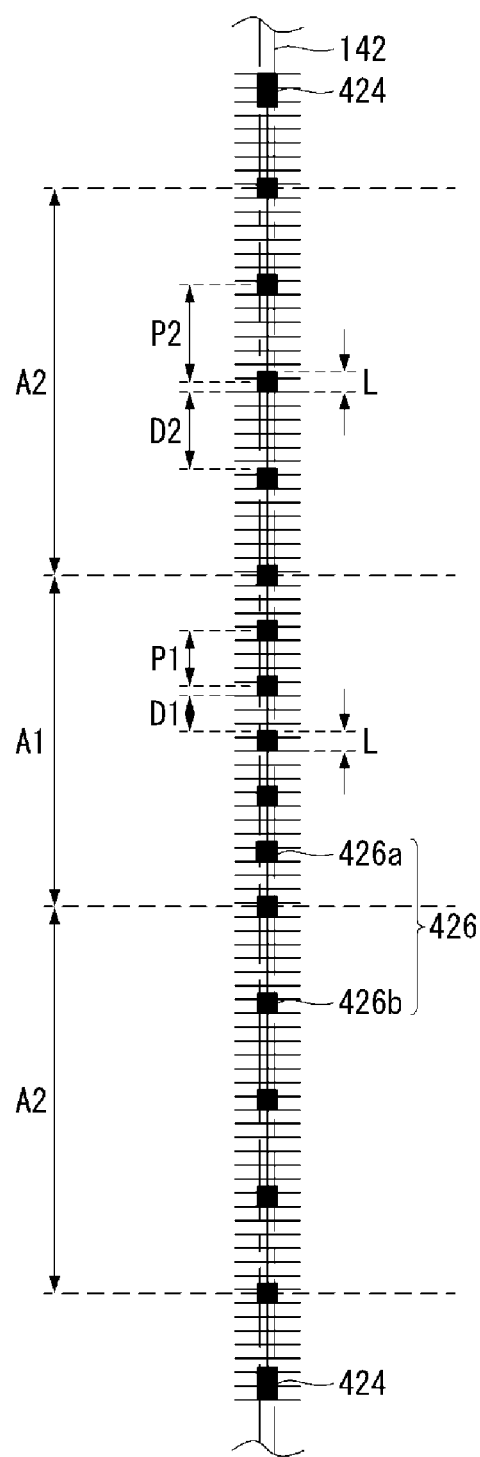
FIG. 6 is a partial plan view showing a state in which the lead is attached to the solar cell in portion A of FIG. 5.

As an example, it is exemplified that all of the bus bars 42b have only the first region A1 and the second region A2 and all of the bus bars 42b have the same arrangement of the inner pads 426 and/or the first and second regions A1 and A2 in FIGS. 5 and 6. According to this, the adhesion property of all of the bus bars 42b can be improved as a whole, and a travel distance of carriers to the pad portion 422 can be uniform by a regular distribution of the inner pads 426.

However, the embodiments of the invention are not limited thereto. For example, the bus bar 42b may has one or more regions, which is different from the first and second regions A1 and A2 in the arrangement or the area of the pad portions 422, other than the first region A1 and the second region A2. Alternatively, the arrangement and/or the area of the inner pads 426 in at least two bus bars 42b may be different. For example, only a part (e.g., at least one) of the plurality of bus bar 42b may have the plurality of regions, which are different from each other in the arrangement or the area of the pad portions 422 (more particularly, the inner pads 426), while the other bus bar 42b may have the pad portions 422 (more particularly, the inner pads 426) having a uniform arrangement and a uniform area as a whole. Alternatively, at least two bus bars 42b may have the plurality of regions, which are different from each other in the different arrangement or area of the pad portions 422, and the arrangement and/or the area of the pad portions 422 in one bus bar 42b and in the other bus bar 42b may be quite different from each other. In one example, positions of the first region A1 and the second region A2 in at least two bus bars 42b may be different from each other, and/or the arrangement and/or the area of the pad portions 422 of at least one of the first and second regions A1 and A2 in at least two bus bars 42b may be different from each other. That is, in the embodiment, it is sufficient that one of the bus bars 42b may have the plurality of regions, which are different from each other in the arrangement or the area of the plurality of pad portions 422, in the second direction.

Hereinafter, the first and second regions A1 and A2 of one bus bar 42b in the second direction will be described in detail. FIG. 6 is a partial plan view showing a state in which the lead is attached to the solar cell in portion A in FIG. 5.

Referring to FIG. 6, the first and second regions A1 and A2 are different from each other in the at least one of the arrangement and the area of the inner pads 426 as described above. This will be described in more detail. Hereinafter, the inner pad 426 positioned in the first region A1 is referred to as a first pad 426a and the inner pad 426 positioned in the second region A2 is referred to as a second pad 426b.

In the specification, the phrase of "the first and second regions A1 and A2 are different from each other in the at least one of the arrangement and the area of the inner pads 426" may mean that a number of the first pads 426a in the first region A1 and a number of the second pads 426b in the second region A2 may be different from each other. Alternatively, it may mean that an interval between the first pad 426a in the first region A1 and an interval between the second pad 426b in the second region A2 may be different from each other. In this instance, the interval means a distance between the closest edges of two adjacent inner pads 426. Alternatively, it may mean that an area of one of (for example, each) of the first pad 426a in the first region A1 and an area of one of (for example, each) of the second pad 426b in the second region A2 may be different from each other. Alternatively, it may mean that an arrangement of the first pads 426a in the first region A1 and an arrangement of the second pads 426b in the second region A2 may be different from each other. Alternatively, it may mean an area ratio (a first area ratio) of the first pad 426a or the first pads 426a to an area of the first region A1 and an area ratio (a second ratio) of the second pad 426b or the second pads 426b to an area of the second region A2 may be different from each other. In this instance, the first area ratio may mean a ratio of a total area of the first pad 426a to the area of the first region A1, and the second area ratio may mean a ratio of a total area of the second region 426b to the area of the second region A2. The area of the first region A1 or the second region A2 may be a value obtained by multiplying a length of the first region A1 or a length of the second region A2 by a constant width (for example, a width of the pad part 422). The total area of the first pad 426a is a total area of all the first pads 426a positioned in the first region A1, and a total area of the second pad 426b is the total area of all the second pads 426a positioned in the second region A2.

In the embodiment, the first area ratio is greater than the second area ratio.

In this instance, the first region A1 may be positioned at an intermediate region in the second direction, and the second region A2 may be positioned at an edge region in the second direction. For example, the second region A2 may include a plurality of (for example, two) second regions A2 at both sides of the first region A1. In this instance, the second regions A2 located at the both sides of the first region A1 may be symmetrical to each other with respect to the first region A1.

Figure 7:
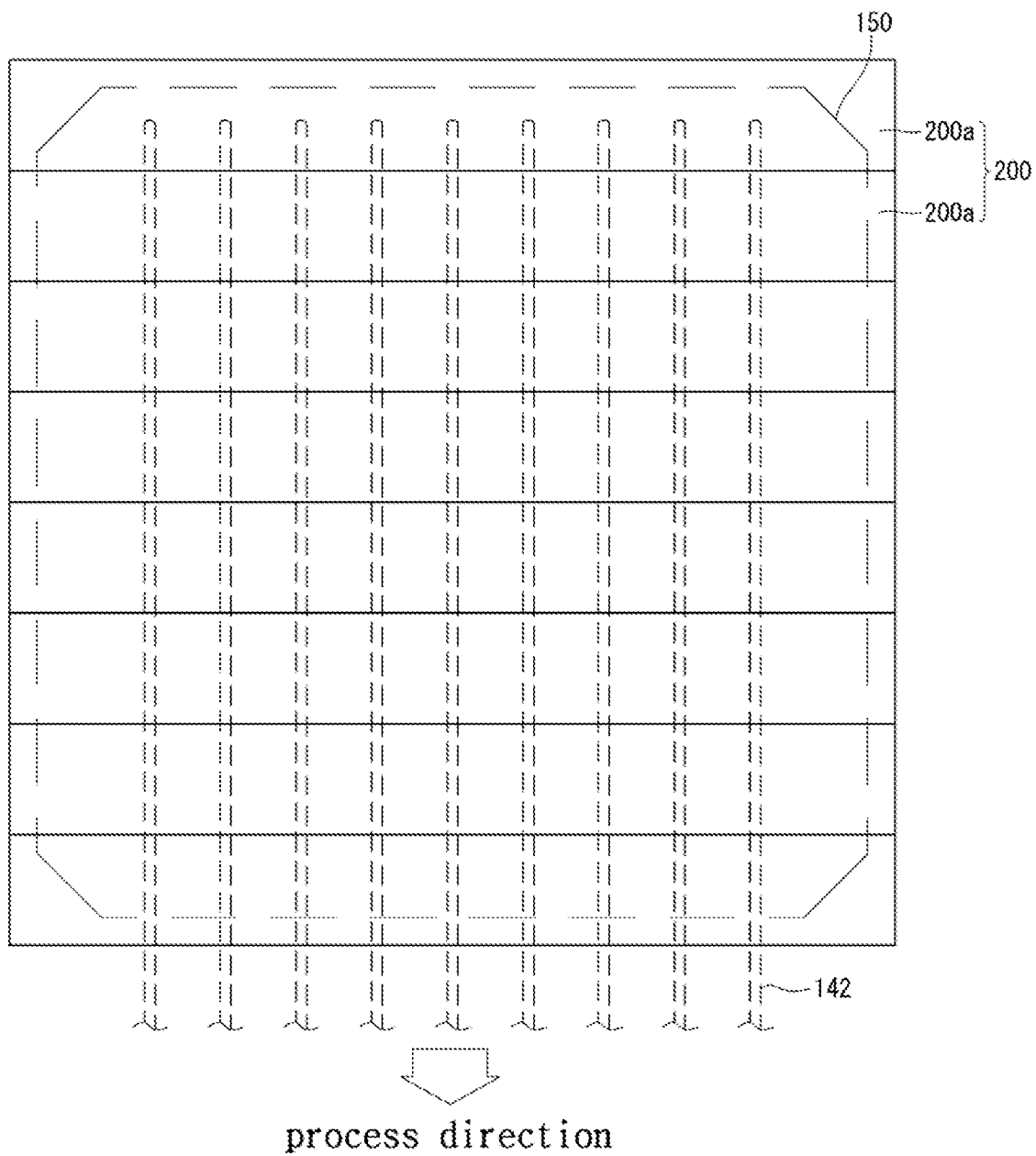
FIG. 7 is a plan view schematically showing an attaching process of the lead and the solar cell shown in FIG. 3.

This is to prevent the lead 142 from being bent in a specific region or an adhesion property of the lead 142 from being deteriorated, which it may be generated when a heat applied to the lead 142 in an attaching process of the lead 142 is not uniform. This will be described in more detail with reference to FIG. 7. FIG. 7 is a plan view schematically showing an attaching process of the lead 142 and the solar cell 150 shown in FIG. 3. For simplicity and clarity, only the solar cell 150, the lead 142, and a heat source unit 200 are schematically shown in FIG. 7.

In the attaching process of the lead 142, a heat source unit 200 supplies a heat to the solar cell 150 in a state where the lead 142 and the solar cell 150 are pressed and fixed, and then, the lead 142 is attached to the solar cell 150. More specifically, the solder layer 142b (refer to FIG. 3) of the lead 142 is melted and soldered by the heat supplied by the heat source unit 200, thereby the lead 142 is electrically connected to the electrode 42 or 44 (refer to FIG. 3) of the solar cell 150.

As an example, the heat source unit 200 may include a plurality of light source members 200a that supply a heat by a light (a radiant heat) to the lead 142. As the heat source unit 200 supplies the heat by the light, it is possible to reduce a time of the attaching process and improve the adhesion property. For example, the light source member 200a may be an infrared lamp. However, the embodiments of the invention are not limited thereto, and thus, any of various structures and systems capable of supplying the heat may be applied to the heat source unit 200. When the heat source unit 200 includes the plurality of light source members 200a, the plurality of light source members 200a can be controlled individually, thereby making it possible to uniformly distribute the light or the heat as a whole. Also, when a failure in some of the light source members 200a, only the failed light source member 200a can be replaced. Accordingly, heat source unit 200 can be used stably. On the other hand, unlike the embodiment, if the heat source unit is formed of one light source member, it may be difficult to individually or partially control the heat source unit, and thus, it may be difficult to uniformly supply the light or the heat to an entire portion of the lead 142.

In this instance, the light source member 200a of the heat source unit 200 or a light source included therein may have a linear shape or may be a linear light source. Thereby, a number of the light source members 200a or the light sources included therein may be reduced while the light source members 200a the light sources include therein are individually controlled. On the other hand, if the light source member 200a or the light source included therein is a point light source, lots of the light source members 200a or the light sources included therein may be necessary, the light source members 200a or the light sources included therein may not be easily controlled, and the light source member 200a or the light source included therein in a failure may not be difficult to find. Each light source member 200a may be disposed across all the leads 142 in a direction that intersects (e.g., orthogonally intersects) the second direction, which is an extension direction of the lead 142 and a process direction. Then, even if some light source members 200a fail and do not operate, other light source members 200a can supply the light to all the leads 142 in order to attach the leads to the solar cell 150. Accordingly, it is possible to prevent a process failure and the like if some light source members 200a fail and do not operate. On the other hand, when the light source member is positioned in a direction parallel to the lead 142, unlike the embodiment, if some light source members do not operate, the light may be not supplied to some leads 142 and thus the corresponding leads 142 may not be attached to the solar cell 15o.

In the attaching process of the lead 142, the plurality of light source members 200 are provided, while a temperature sensor (not shown) may be located only at a central portion of the solar cell 150. Thus, the heat supplied to the solar cell 150 and the lead 142 from the plurality of light source members 200a may be different in the second direction. Then, the lead 142 may be bent or the adhesion property of the lead 142 may be deteriorated in a specific region. In the above structure, the lead 142 may be bent in an intermediate region in the second direction, and thus, the first region A1 having a relatively large first area ratio is positioned at the intermediate region to prevent this. The second region A2 having a relatively small second area ratio is positioned at the edge region where a possibility of bending the lead 142 is less likely in order to reduce an amount of material for forming the pad portions 422.

That is, in the embodiment, the first and second regions A1 and A2 are arranged in consideration of a heat or temperature difference in the second direction in the attaching process of the lead 142. Accordingly, the adhesion property of the leads 142 can be improved as a whole.

Although the heat source unit 200 using the light source member 200a or a light source having a linear shape is exemplified as an example, the embodiments of the invention are not limited thereto. A difference of the heats supplied to the intermediate region and the edge region or a temperature difference between the intermediate region and the edge region when a light source unit supplying a hot air is used may be greater than that when the light source unit 200 having the linear shape is used. Therefore, the solar cell 150 according to the embodiment may also be applied in such a case. In addition, the solar cell 150 according to the embodiment may be applied when the difference in the heat or the temperature in the attaching process of the lead 142 is large. Depending on a distribution of the heat or temperature difference, an arrangement of the first and second regions A1 and A2 may be varied.

Referring to FIGS. 5 and 6 again, for example, a length ratio of a length of the first region A1 to a length of each second region A2 in the second direction may be 0.5 to 3. As an example, the length ratio of the length of the first region A1 to the length of each second region A2 in the second direction may be 1 to 2. This range may be limited to reduce a cost of electrode materials by the second region A2 and to achieve an effect by the first region A1. In particular, when the length of the first region A1 is the same as or greater than the length of the second region A2, the effect of the first region A1 can be maximized.

In the embodiment, a plurality of first pads 426a are spaced apart from each other at a first interval D1 in the first region A1, and a plurality of second pads 426b are spaced apart from each other at a second interval D2 greater than the first interval D1. In this instance, the first and second pads 426a and 426b having the same area (or the same size) are spaced from each other with uniform distances in the first and second regions A1 and A2 and the first interval D1 is smaller than the second interval D2. Therefore, the first area ratio is greater than the second area ratio.

In one embodiment, for example, a first pitch P1 of the plurality of first pads 426a in the first region A1 may be smaller than a second pitch P2 of the plurality of second pads 426b in the second region A2. In this instance, the first pitch P1 is a distance between centers of two adjacent first pads 426a, and the second pitch P2 is a distance between centers of two adjacent second pads 426b. In this instance, the first pad 426a and the second pad 426b have the same width and length L, and thus, may have the same area and shape. As such, the first and second regions A1 and A2 may be distinguished from each other by different pitches or intervals of the first pads 426a and the second pads 426b while keeping that the areas and shapes of the first and second pads 426a and 426b are the same as each other.

However, the embodiments of the invention are not limited thereto. Accordingly, the first ratio and the second ratio, or the first interval D1 of the first pad 426a and the second interval D2 of the second pad 426b may be different from each other by any of various methods. Other examples will be described with reference to FIGS. 8 and 9.

Figure 8:
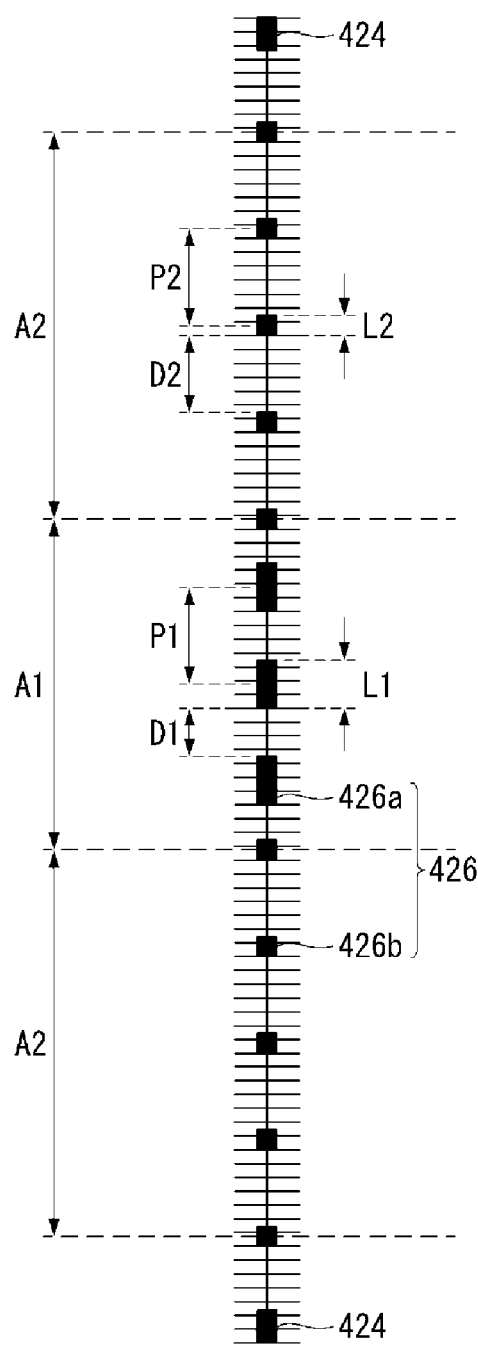
FIG. 8 is a partial plan view of a solar cell according to a modified embodiment of the invention.

FIG. 8 is a partial plan view of a solar cell according to a modified embodiment of the invention. FIG. 8 shows a portion corresponding to the portion shown in FIG. 6, but a lead is omitted for simplicity and clarity.

Referring to FIG. 8, a plurality of first pads 426a are spaced apart from each other with uniform intervals and a plurality of second pads 426b are spaced apart from each other with uniform intervals, as in the embodiment of FIG. 6. In this instance, a first pitch P1 of the plurality of first pads 426a in a first region A1 is the same as a second pitch P2 of the plurality of second pads 426b in a second region A2, and an area of each first pad 426a is greater than an area of each second pad 426b. Then, a first interval D1 is smaller than a second interval D2, and thus, a first area ratio is greater than a second area ratio.

In order to increase the area of the first pad 426a to be greater than the area of the second pad 426b, a first length L1 of the first pad 426a in a second direction may be greater than a second length L2 of the second pad 426b in the second direction. A width of the first pad 426a in a first direction and a width of the second pad 426b in the first direction may be the same as each other. The lengths of the first and second pads 426a and 426b are measured in the second direction in which the lead 142 extends. Thus, as the lengths of the first and second pads 426a and 426b increase, areas of the pad portion 422 where the lead 142 is attached with a strong adhesive force can be increased. Accordingly, when the lengths of the first and second pads 426a and 426b increase, the adhesion property with the lead 142 can be improved. On the other hand, it is sufficient that the first and second pads 426a and 426b may have widths that the lead 142 may be attached thereto. Even if the width is greater than that, it may not contribute improve the adhesion property of the lead 142 and may increase an optical loss. For this reason, in the embodiment, the first and second lengths L1 and L2 of the first and second pads 426a and 426b are different from each other.

Figure 9:
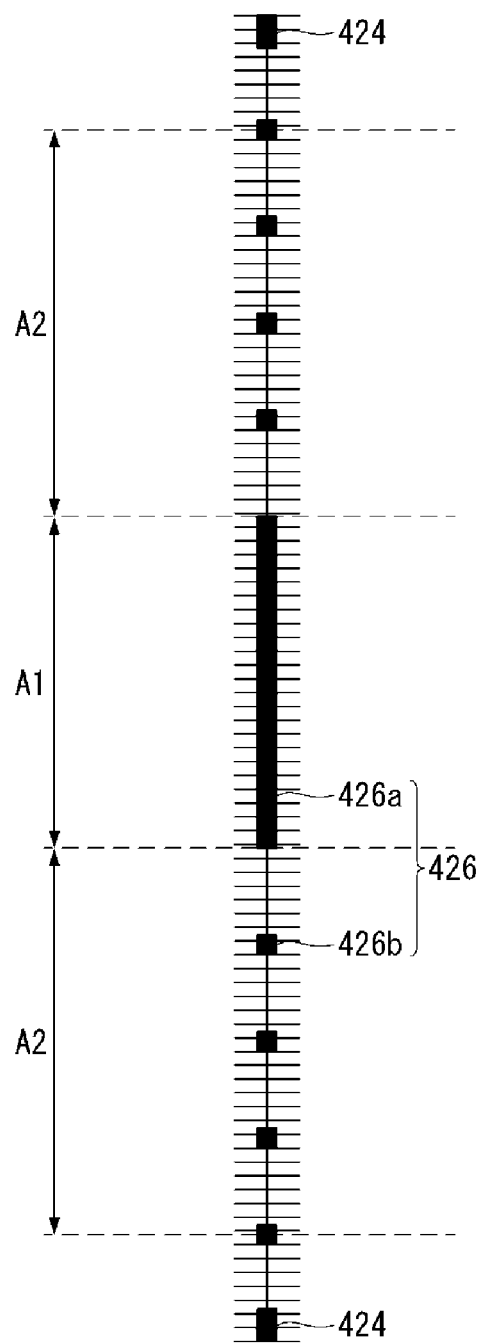
FIG. 9 is a partial plan view of a solar cell according to another modified embodiment of the invention.

FIG. 9 is a partial plan view of a solar cell according to another modified embodiment of the invention. FIG. 9 shows a portion corresponding to the portion shown in FIG. 6, but a lead is omitted for simplicity and clarity.

Referring to FIG. 9, one single first pad 426a is included and a plurality of second pads 426b are spaced apart from each other with uniform intervals. In this instance, one single first pad 426a is elongated along the second direction to have a relatively large first area ratio in the first region A1, and a plurality of second pads 426b are positioned to have a relatively small second area ratio in the first region A2. In this instance, a width of the first pad 426a and a width of the second pad 426b may be the same as each other.

In the above embodiments and modified embodiments, it is exemplified that the first region A1 having the relatively large first area ratio is positioned at the intermediate region and the second region A2 having the relatively small second area ratio is positioned at the edge region. However, the embodiments of the invention are not limited to thereto. Accordingly, the first region A1 having the relatively large first area ratio may be positioned at the edge region adjacent to the outer pad 424. This will be described in detail with reference to FIG. 10 later.

In the solar cell 150 and the solar cell panel 100 including the same, a light loss can be minimized by using the bus bar 42b having a small width and/or the lead 142 having a wire shape, and a movement path of carriers can be reduced by increasing a number of bus bars 42b and/or the leads 142. Thus, an efficiency of the solar cell 150 and an output of the solar cell panel 100 can be enhanced.

In this instance, the first region A1 having the relatively large first area ratio is disposed in an intermediate region where a deformation of the lead 142 may occur due to uneven heat in an attaching process of the lead 142, thereby preventing or minimizing the deformation of the lead 142. Thus, an output and a reliability of the solar cell panel 100 including the solar cell 150 can be improved.

However, the embodiments of the invention are not limited to the above arrangement of the first and second regions A1 and A2, the above arrangement of the first and second pads 426a and 426b, or the like. Hereinafter, various embodiments will be described below with reference to FIGS. 10 to 12.

Figure 10:
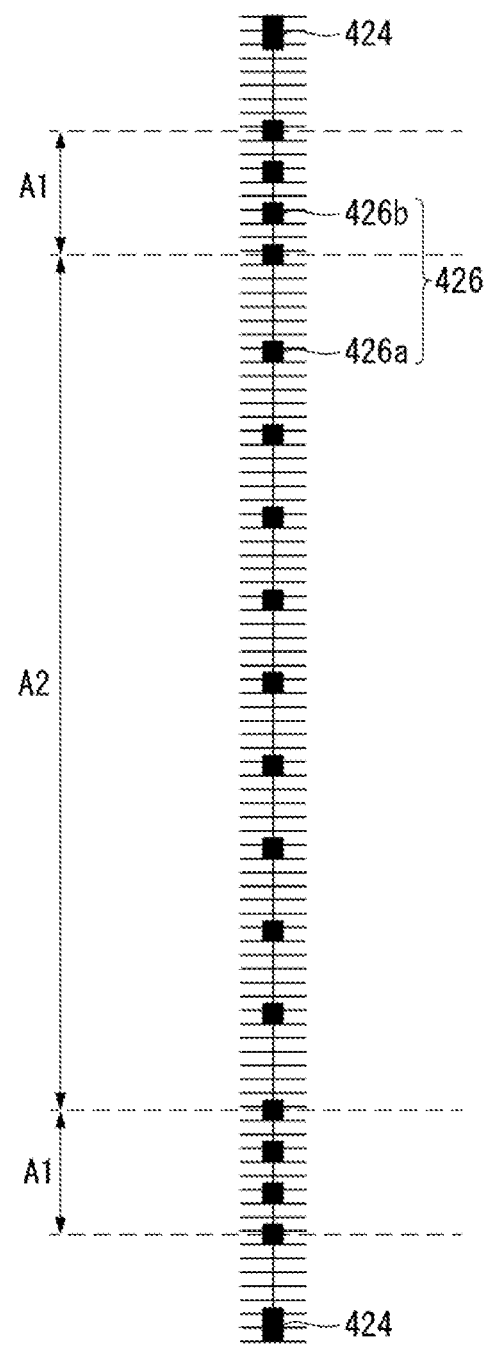
FIG. 10 is a partial plan view of a solar cell according to another embodiment of the invention.

FIG. 10 is a partial plan view of a solar cell according to another embodiment of the invention. FIG. 10 shows a portion corresponding to the portion shown in FIG. 6, but a lead is omitted for simplicity and clarity.

Referring to FIG. 10, in the embodiment, a first region A1 having a relatively large first area ratio is positioned at an edge region adjacent to an outer pad 424, and a second region A2 is positioned at a region other than the edge region. Thus, the second region A1 is farther from the outer pad 424 than the first region A1.

Since a lead 142 (refer to FIG. 4) is extended from a front surface of a first solar cell 151 (refer to FIG. 4) to a back surface of a second solar cell 152 (refer to FIG. 4) at a portion adjacent to the outer pad 424, a curvature of the lead 142 at the portion adjacent to the outer pad 424 is greater than a curvature of the lead 142 at the other portion. A force away from the first and second solar cells 151 and 152 at the portion adjacent to the outer pad 424 is applied to the lead 142, and thus, the lead 142 may be peeled off from the outer pad 424. In particular, in the embodiment, the lead 142 having a small width and a rounded portion may have such a problem because an attachment area of the lead 142 with an electrode is small. Considering this, in the embodiment, the first region A1 having a relatively large first area ratio is positioned at a portion adjacent to the outer pad 424, and thus, a contact area of the inner pad 426 and the lead 142 at the edge portion can increase and an adhesion property can be enhanced. Thus, the peeling of the lead 142, which may occur at the portion adjacent to the outer pad 424, can be effectively prevented.

In the embodiment, the second region A2 may be positioned at the intermediate region in the second direction, and the first region A1 may include a plurality of first regions A1 (for example, two first regions A1) positioned at the edge regions at both sides of the second region A2. In this instance, the first regions A1 positioned at the both sides of the second region A2 may be positioned symmetrically with respect to the second region A2. Since the first region A1 improves the adhesion property of the lead 142 at the portion adjacent to the outer pad 424, the first region A1 may not be formed too long. Thus, a length of each first region A1 may be less than a length of the second region A2.

In FIG. 10, it is exemplified that the first pad 426a and the second pad 426b have the arrangements and the shapes as shown in FIG. 6. The embodiments of the invention are not limited thereto. Thus, the first pad 426a and the second pad 426b may have arrangements and shapes as shown in FIGS. 8 and 9.

In the embodiments and the modified embodiments described above, the plurality of first pads 426a located in the first region A1 and/or the plurality of second pads 426b located in the second region A2 have uniform intervals and uniform area. However, the embodiments of the invention are not limited thereto. Other embodiment will be described in detail with reference to FIG. 11.

Figure 11:
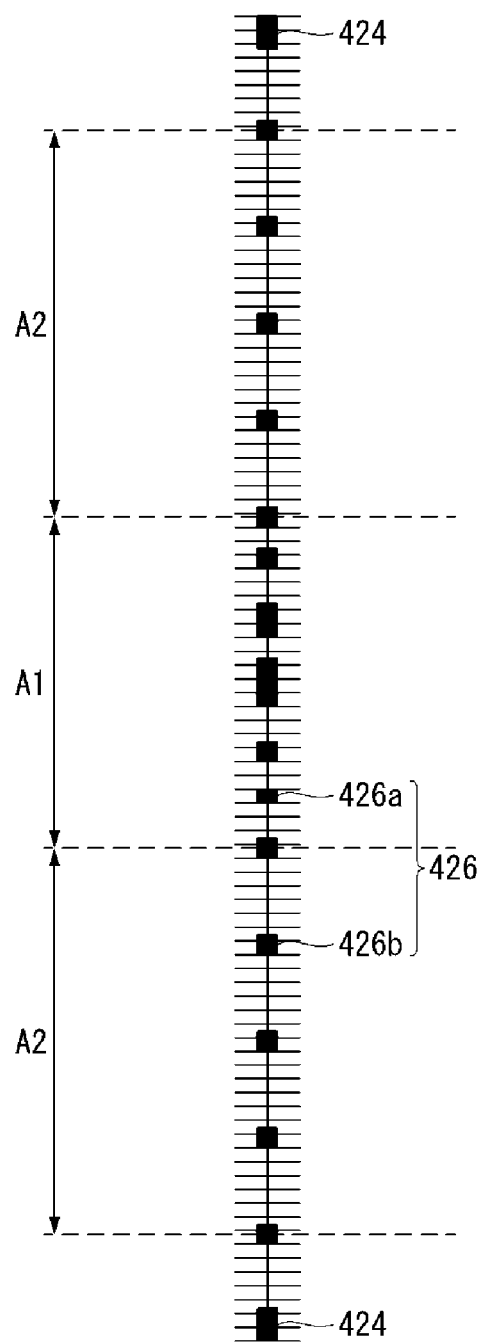
FIG. 11 is a partial plan view of a solar cell according to yet another embodiment of the invention.

FIG. 11 is a partial plan view of a solar cell according to yet another embodiment of the invention. FIG. 11 shows a portion corresponding to the portion shown in FIG. 6, but a lead is omitted for simplicity and clarity.

Referring to FIG. 11, in the embodiment, a plurality of second pads 426b are regularly positioned to be spaced apart from each other at a uniform interval in a second region A2.

In this instance, the plurality of second pads 426b may have the same width and the same length and thus have the same area.

On the other hand, in a first region A1, a plurality of first pads 426a are spaced apart from each other with irregular intervals, and/or the plurality of first pads 426a may have different sizes. In the drawing, it is exemplified that the first pads 426a are spaced apart from each other with irregular intervals and have different sizes. For example, the first pads 426a have different lengths so that the first pads 426a have different sizes.

In the above embodiments and modified embodiments, it is exemplified that only the first region A1 and the second region A2 are provided. However, the embodiments of the invention are not limited thereto. Other embodiment will be described in detail with reference to FIG. 12.

Figure 12:
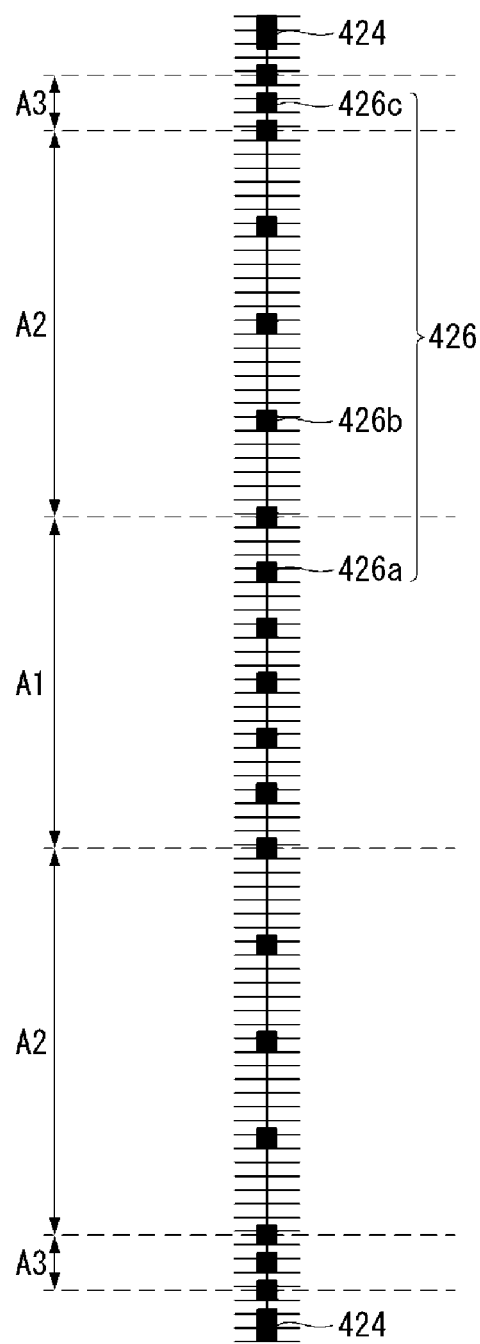
FIG. 12 is a partial plan view of a solar cell according to yet still another embodiment of the invention.

FIG. 12 is a partial plan view of a solar cell according to yet still another embodiment of the invention. FIG. 12 shows a portion corresponding to the portion shown in FIG. 6, but a lead is omitted for simplicity and clarity.

Referring to FIG. 12, in the embodiment, a bus bar 42b may have a first region A1, a second region A2, and a third region A3 in a second direction. The third region A3 may include at least one third pad 424c. At least one of an arrangement and an area of the at least one third pad 424c of the third region A3 may be different that of first and second pads 426a of the first and second regions A1 and A2.

As an example, the descriptions of the first and second regions A1 and A2 described in the embodiment of FIG. 6 may be applied to the first and second regions A1 and A2 as they are. The third pad 424c in the third region A3 may have a third area ratio that is greater than first and second area ratios. In one example, it is shown that a third pitch of the third pads 424c is smaller than each of first and second pitches of the first and second pads 426a and 426b, respectively. However, the embodiments of the invention are not limited thereto. The third area ratio may be smaller than each of the first and second area ratios by any of various methods.

In the drawings, it is exemplified that the first region A1 is located in an intermediate region, the third regions A3 are located adjacent to outer pads 424 at both edge regions, respectively, and the second regions A2 are located between the first region A1 and the third regions A3, respectively. According to this, the bending of the lead 142 can be minimized by the first region A1, and the adhesion property of the lead 142 can be enhanced by the third region A3. However, the embodiments of the invention are not limited thereto. Thus, an arrangement of the first to third regions A1, A2, and A3 may be variously modified.

One of the first and second regions A1 and A2 shown in FIGS. 6, 8 to 11 may be applied to each of the first to third regions A1, A2, and A3 of FIG. 12. All embodiments and modified embodiments described herein may be combined with one another, and embodiments in accordance with all combinations are within the scope of the invention. In addition, in the above embodiments and modified embodiments, it is exemplified that one of the first and second regions A1 and A2 is symmetrically positioned based on the other of the first and second regions A1 and A2. Then, the current can stably flow. However, the embodiments of the invention are not limited thereto. Thus, a plurality of regions, which are different from each other in at least of an arrangement and an area of the pad portion 422, may be variously arranged.

Figure 13:
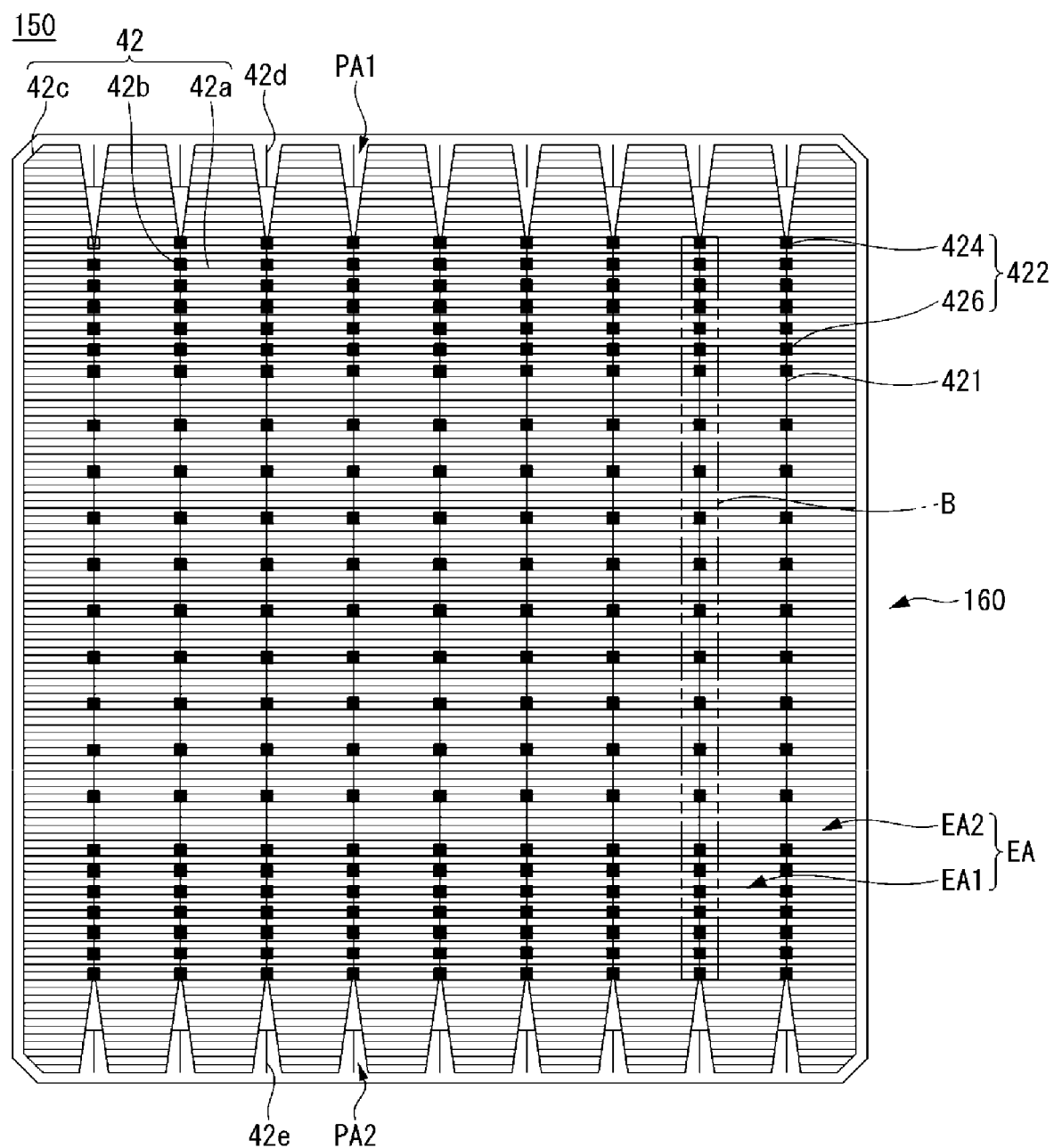
FIG. 13 is a front plan view of a solar cell according to still another modified embodiment of the invention.
Figure 14:
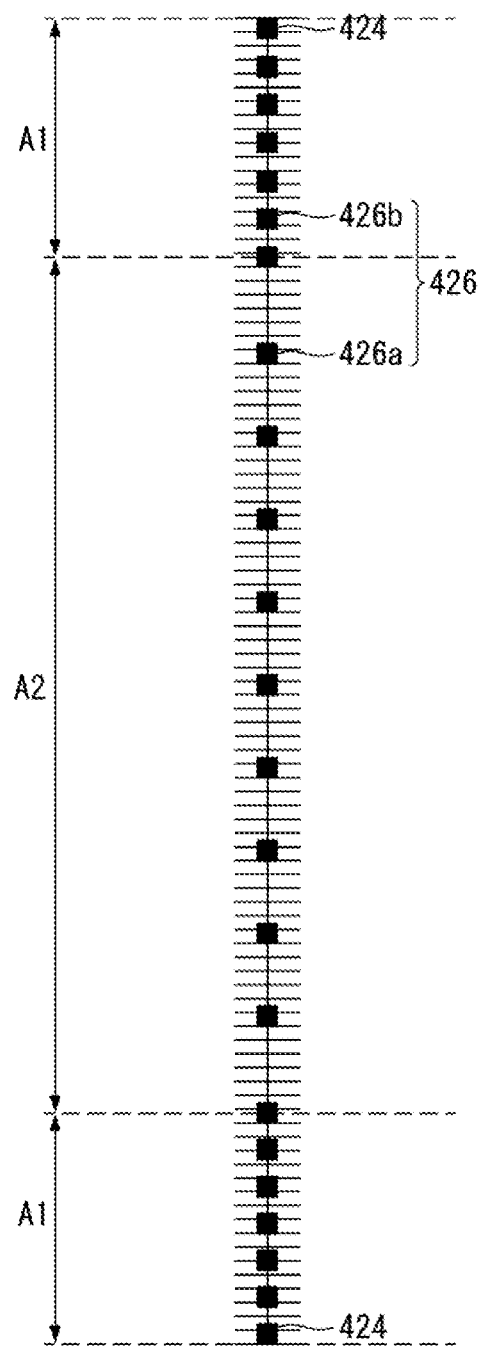
FIG. 14 is an enlarged partial plan view of portion B of FIG. 13.

FIG. 13 is a front plan view of a solar cell according to still another modified embodiment of the invention, and FIG. 14 is an enlarged partial plan view of portion B of FIG. 13.

Referring to FIGS. 13 and 14, in the embodiment, a plurality of pad portions 422 including an outer pad 424 may include a first region A1 and a second region A2, which are different from in at least one of an arrangement and an area of the plurality of pad portions 422. In this instance, inner pads 426 and the outer pad 424 positioned in the first region A1 may have uniform areas and uniform intervals, and the inner pads 426 positioned in the second region A2 may have uniform areas and uniform intervals. In the modified embodiment, for example, it is exemplified that the outer pad 424 has the same area as the inner pad 426, but the embodiments of the invention are not limited thereto. Therefore, in the second region A2, intervals of the outer pad 424 and the inner pads 426 may be uniform, while an area (e.g., a length) of the outer pad 424 may be greater than an area (e.g., a length) of the inner pad 426.

In FIG. 13, for example, it is exemplified that a width of a first electrode area EA1 is greater than a width of a second electrode area EA2. Also, it is exemplified that an electrode portion 42d at a first edge region PA1 and an electrode portion 42e at a second edge region PA2 of the other edge are symmetrical to each other. However, the embodiments of the invention are not limited thereto.

Figure 15:
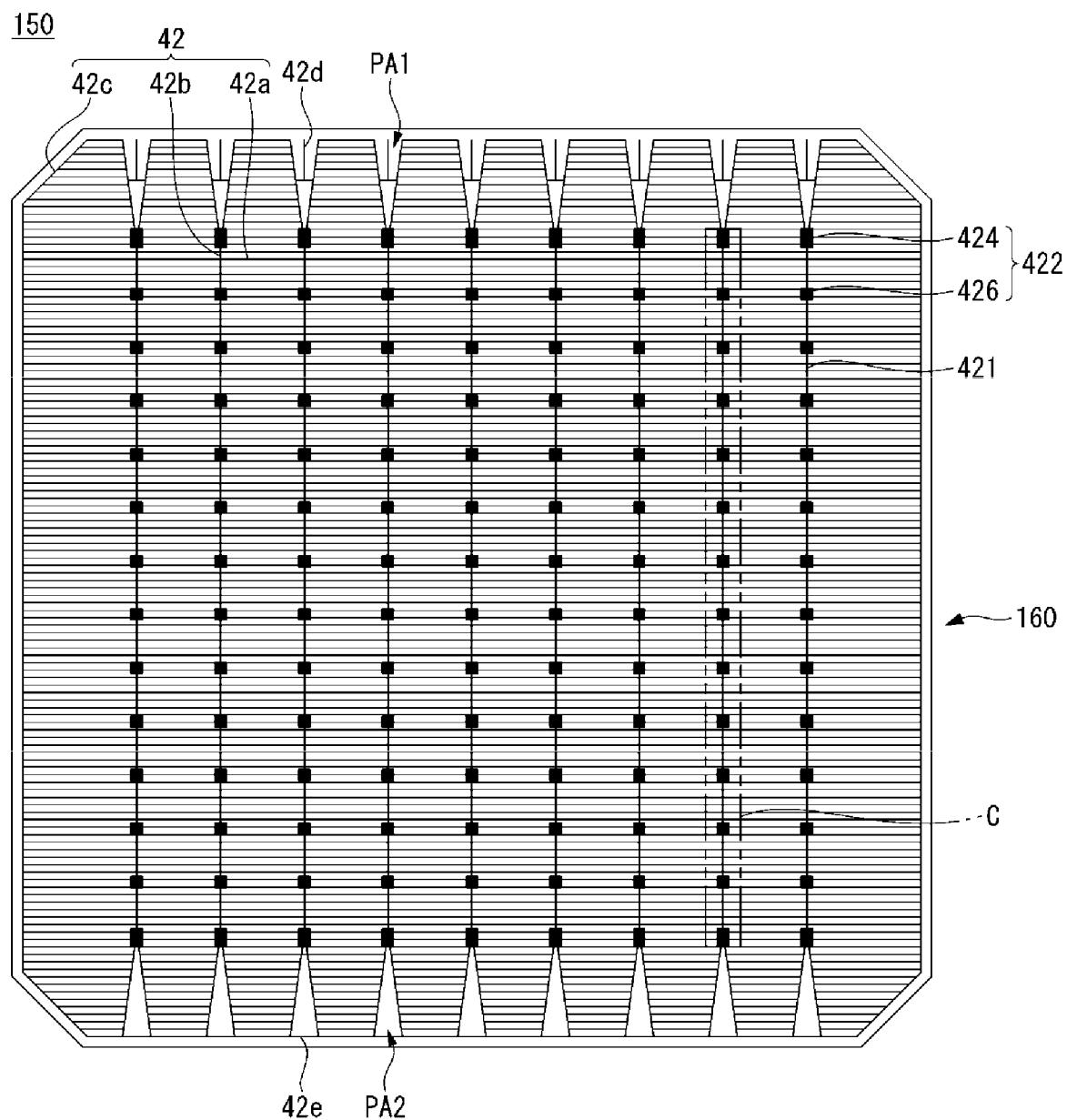
FIG. 15 is a front plan view of a solar cell according to yet still another embodiment of the invention.
Figure 16:
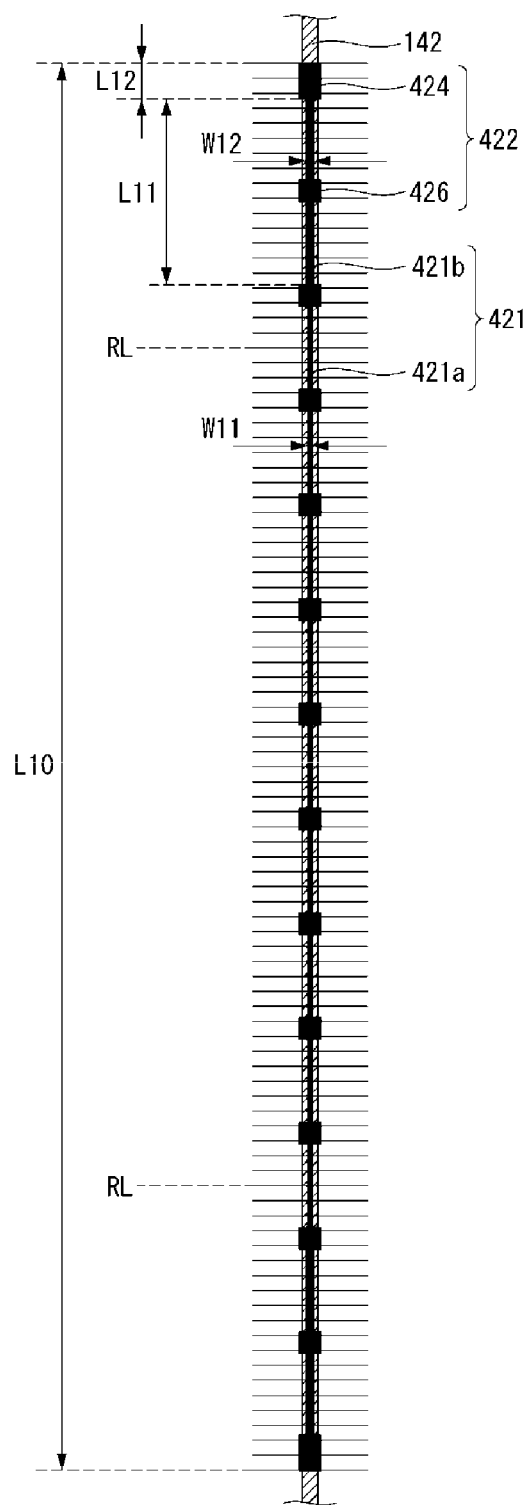
FIG. 16 is a partial plan view for showing a state that a lead is attached to the solar cell in portion C of FIG. 15.

FIG. 15 is a front plan view of a solar cell according to yet still another embodiment of the invention, and FIG. 16 is a partial plan view for showing a state that a lead is attached to the solar cell in portion C of FIG. 15.

Referring to FIGS. 15 and 16, in the embodiment, a line portion 421 includes a main line portion 421a and a wide portion 421b each including at least one inner pad 426. The main line portion 421a may be spaced apart from the outer pad 424 and may be positioned at an intermediate region of the bus bar 42b. The wide portion 421b may be positioned adjacent to the outer pad 424. As described briefly in the above, an adhesion property of a lead 142 may be low at a portion where the outer pad 424 is positioned. This will be explained in more detail.

In the embodiment, the lead 142 having a small width may have a small attachment area with the electrode 42 or 44, and thus, an adhesion property may be deteriorated. Further, when the lead 142 has a cross section of a circular shape, an elliptical shape, or a rounded shape, the attachment area between the lead 142 and the electrode 42 or 44 is small and a thickness of the lead 142 is large, and thus, the solar cell 150 or the semiconductor substrate 160 may be easily bent.

Particularly, between the first solar cell 151 and the second solar cell 152, the lead 142 is connected from a front surface of the first solar cell 151 to a back surface of the second solar cell 152. Therefore, the lead 142 may be bent at a portion between the first solar cell 151 and 152. That is, as shown in FIG. 4, a first portion of the lead 142 is attached to (e.g., is in contact with) a first electrode 42 of the first solar cell 151 and a second portion of the lead 142 is attached to (e.g., is in contact with) a second electrode 44 of the second solar cell 152. A third portion of the lead 142 positioned between the first and second solar cells 151 and 152 is connected to the first and second portions without being broken. Accordingly, the third portion includes a bent portion having a convex arc shape at edge portions of the first and second solar cells 151 and 152. As a result, a force is applied in a direction away from the first and second solar cells 151 and 152 to the bent portion having the convex arc shape in the lead 142. Thereby, the adhesion property of the outer pad 424 and the leads 142 positioned at the edge portion of the first and second solar cells 151 and 152 may be lower than the adhesion property of the inner pads 426 and the lead 142.

In order to compensate for this, in the embodiment, the wide portion 421b may be formed adjacent to the outer pad 424. That is, the wide portion 421b is formed at a portion adjacent to the outer pad 424 to additionally secure an attachment area between the lead 142 and the electrode 42 or 44, the adhesion properties of the electrode 142 and the electrode 42 or 44 can be improved.

That is, according to the embodiment, a shading loss and a cost of an electrode material can be reduced by the main line portion 421a having a small first width W11 at a whole portion, while the adhesion property between the lead 142 and the electrode 42 or 44 can be improved by the wide portion 421b that is adjacent to the outer pad 424 and having a relatively large second width W12.

In this instance, the main line portion 421a has a length greater than a total length of the wide portion 421b (that is, a sum of lengths of all the wide portions 421b). Thus, the main line portion 421a is a portion having the largest length in the bus bar 42b, and the length of the wide portion 421b is smaller than the length of the main line portion 421a. The shading loss and the cost of the electrode material can be effectively reduced by the relatively long main line portion 421a. It is sufficient that the wide portion 421b is partially formed for increasing the adhesion property at the portion adjacent to the outer pad 424.

For example, the wide portion 421b may be positioned between an imaginary reference line RL and the outer pad 424. The imaginary reference line RL is spaced from an edge of the semiconductor substrate 160 (that is, a side or an edge 161 or 162 of FIG. 4) by a predetermined distance. As an example, the imaginary reference line RL may be at a position spaced apart from an outer edge of one outer pad 424 by 0.2 times a length L10 between the outer edges of both outer pads 424 in the second direction. Alternatively, the imaginary reference line RL may be at a position away from the outer edge of the outer pad 424 by 3 cm in the second direction. If the wide portion 421b is positioned at the region beyond the imaginary reference line RL described above, the effect of improving the adhesion property is not greatly increased, and the cost of the electrode material may increase. However, the embodiments of the invention are not limited thereto.

Each of lengths L11 of the wide portion 421b may be the same as or greater than a distance between the outer pad 424 and the inner pad 426 adjacent to the same or between two adjacent inner pads 426. Accordingly, at least one inner pad 426 may be positioned at the wide portion 421b. For example, at least two inner pads 426 may be positioned at the wide portion 421b. Alternatively, the length L11 of the wide portion 421b may be the same as or greater than a length L12 of the outer pad 424. Then, the wide portion 421b has a length of a certain level or more and may have a shape of a wide line portion, and thus, an attachment area with the lead 142 can be sufficiently secured.

Figure 17:
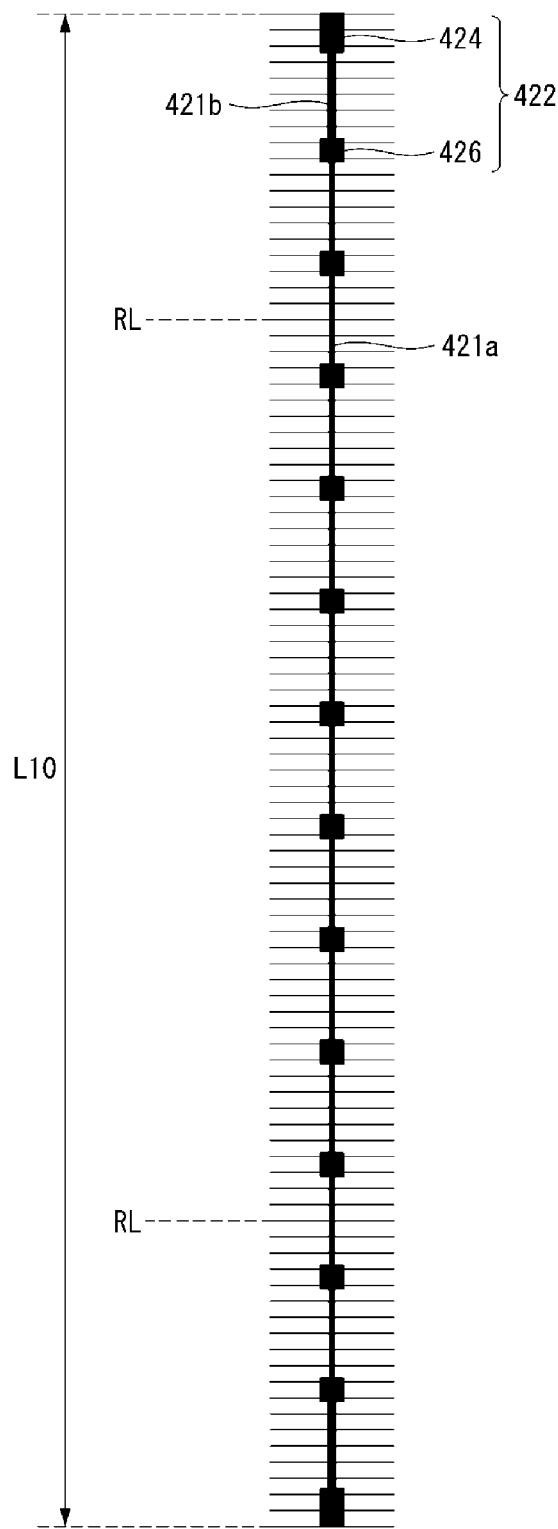
FIG. 17 is a partial plan view of a solar cell according to still another modified embodiment of the invention.

In the embodiment, the wide portion 421b may be in contact with the outer pad 424 and extend from the outer pad 424 to the main line portion 421a. More specifically, the wide portions 421b may be formed one by one in contact with the outer pads 424 positioned at both sides, and the main line portion 421a may be positioned between the two wide portions 421b. Then, the main line portion 421a spaced apart from the outer pad 424 is connected to the outer pad 424 through the wide portion 421b. For example, at least two inner pads 426 positioned at the wide portion 421b and the outer pads 424 may be continuously connected to the main line portion 421a through the wide portion 421b. It is exemplified in drawings that the wide portion 421b is in contact with the outer pad 424 and extends from the outer pad 424 and is continuously connected to the main line portion 421a via the at least two inner pads 426 positioned at the wide portion 421b. Accordingly, the length L11 of the wide portion 421b can be sufficiently secured, and the effect of the wide portion 421b can be maximized. However, the embodiments of the invention are not limited thereto. Thus, as shown in FIG. 17, only one inner pad 426 may be positioned at the wide portion 421b, and the wide portion 421b may connect only the outer pad 424 and the inner pad 426. Alternatively, three or more inner pads 426 may be positioned at the wide portion 421b. Alternatively, the length L11 of the wide portion 421b may be the same as or less than the length L12 of the outer pad 424.

At least one inner pad 426 is also positioned at the main line portion 421a. Since the main line portion 421a is longer than the wide portion 421b and the inner pads 426 are spaced apart from each other at regular intervals, a number of the inner pads 426 positioned at the main line portion 421a may be greater than a number of the inner pads 426 positioned at the wide portion 421b. However, the embodiments of the invention are not limited thereto. The numbers of the inner pads 426 positioned at the main line portion 421a and at the wide portion 421b may have any of various values.

In the embodiment, it is exemplified that the wide portion 421b has a second width W12 which is greater than a first width W11 of the main line portion 421a and which is smaller than a width of the outer pad 424 at a whole portion. That is, the wide portion 421b may have the uniform second width W12. Thus, the adhesion property at the portion adjacent to the outer pad 424 can be uniformly improved, and the wide portion 421b can be easily and stably manufactured. In this instance, a ratio (W12/W11) of the second width W12 of the wide portion 421b to the first width W11 of the main line portion 421a may be 2 to 5. If the ratio is less than 2, the effect of the wide portion 421b may not be sufficient, and if it exceeds 5 times, the cost of the electrode material may increase.

In one example, the ratio of the second width W12 of the wide portion 421b to the width of the outer pad 424 may be 0.03 to 0.5. The ratio is limited in consideration with the attachment area by the wide portion 421b while minimizing the shading loss and the cost of the material, but the embodiments of the invention are not limited thereto. The ratio of the second width W12 of the wide portion 421b to the width of the outer pad 424 may be less than 0.03 or more than 0.5.

In the solar cell 150 and the solar cell panel 100 including the same, a light loss can be minimized by the bus bar 42b having a small width and/or the lead 142 having a wire shape, and a movement path of carriers can be reduced by increasing a number of bus bars 42b and/or the leads 142. Thus, an efficiency of the solar cell 150 and an output of the solar cell panel 100 can be improved.

In this instance, a deterioration of an adhesion property of the lead 142, which may occur at a portion adjacent to the outer pad 424, can be compensated by the wide portion 421b having a wide width at a portion of the line portion 421 adjacent to the outer pad 424. Thus, the lead 142 can have a uniform and excellent adhesion property at a whole portion, and an output and a reliability of the solar cell panel 100 including the solar cell 150 can be improved.

Figure 18:
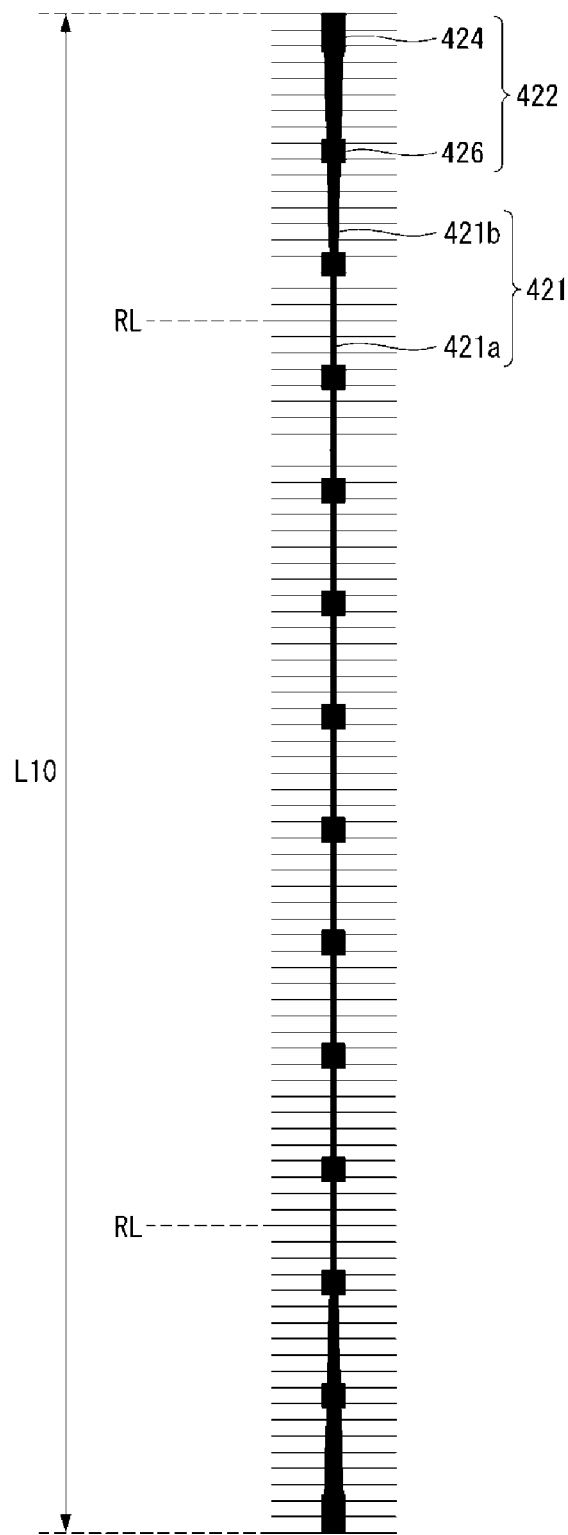
FIG. 18 is a partial plan view of a solar cell according to still another modified embodiment of the invention.

FIG. 18 is a partial plan view of a solar cell according to still another embodiment of the invention. FIG. 18 shows a portion corresponding to the portion shown in FIG. 16, but a lead is omitted for simplicity and clarity.

Referring to FIG. 18, in the embodiment, a wide portion 421b may have a shape gradually increasing in width from a main line portion 421a toward an outer pad 424. By gradually increasing the width of the wide portion 421b toward the outer pad 424, the wide portion 421b has a wide width at a portion adjacent to the outer pad 424 where an adhesion property may be deteriorated. Thus, the deterioration of the adhesion property, which may occur at the portion adjacent to the outer pad 424, can be effectively compensated without greatly increasing an area of the wide portion 421b.

Although it is exemplified that the width of the wide portion 421b gradually increases toward the outer pad 424 in the drawing, the embodiments of the invention are not limited thereto. Thus, the width of the wide portion 421b may decrease toward the outer pad 424, the width of the wide portion 421b may increase and then decrease toward the outer pad 424, or the width of the wide portion 421 may decrease and then increase toward the outer pad 424. Thus, the width of the wide portion 421b may be variously changed.

Figure 19:
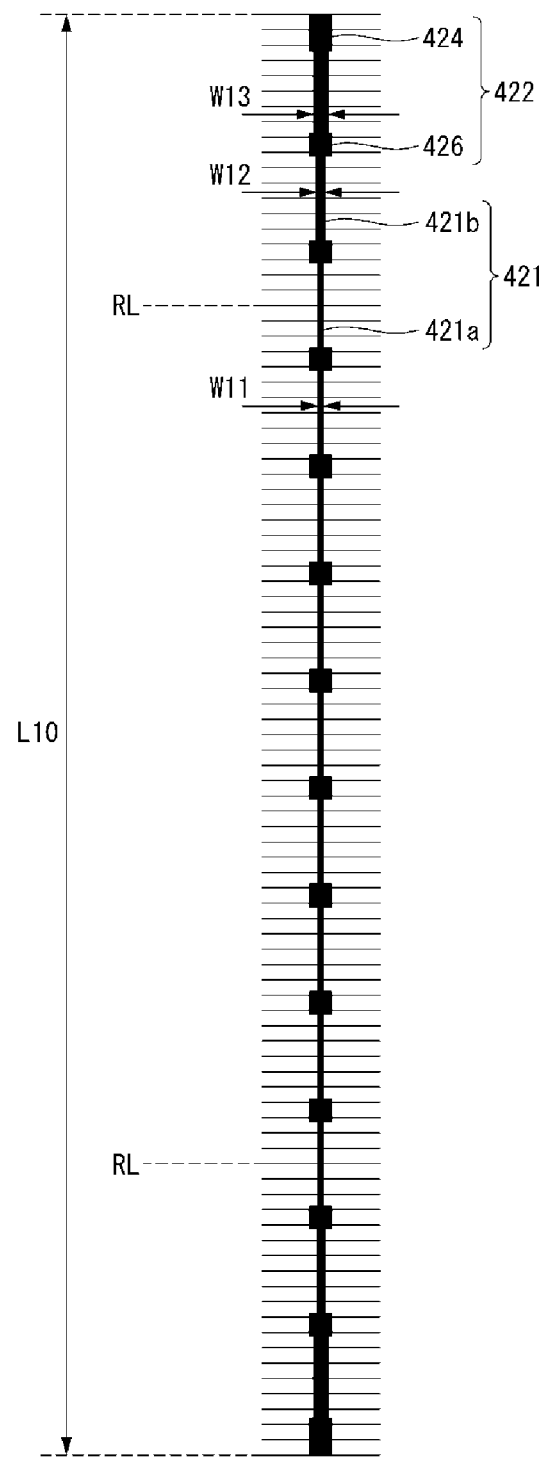
FIG. 19 is a partial plan view of a solar cell according to still another modified embodiment of the invention.

FIG. 19 is a partial plan view of a solar cell according to still another embodiment of the invention. FIG. 19 shows a portion corresponding to the portion shown in FIG. 16, but a lead is omitted for simplicity and clarity.

Referring to FIG. 19, in the embodiment, a wide portion 421b may have a shape stepwisely increasing in width from a main line portion 421a toward an outer pad 424. That is, a width W12 of a portion of the wide portion 421b adjacent to the main line portion 421a may be greater than a width W13 of a portion of the wide portion 421b adjacent to the outer pad 424. By stepwisely increasing the width of the wide portion 421b toward the outer pad 424, the wide portion 421b has a wide width at a portion adjacent to the outer pad 424 where an adhesion property may be deteriorated. Thus, the deterioration of the adhesion property, which may occur at the portion adjacent to the outer pad 424, can be effectively compensated without greatly increasing an area of the wide portion 421b.

Although it is exemplified that the wide portion 421b includes two parts having different widths in the drawing, the embodiments of the invention are not limited thereto. Thus, the wide portion 421b may include at least three parts having different widths, and a width of wide portion 421b including the at least three parts may stepwisely increase toward the outer pad 424. However, the embodiments of the invention are not limited thereto. Thus, the wide portion 421b may include at least two parts having different widths, and the width of the wide portion 421b may decrease toward the outer pad 424, the width of the wide portion 421b may be increase and then decrease toward the outer pad 42, or the width of the wide portion 421 may decrease and then increase toward the outer pad 42. Thus, positions of the at least two parts constituting the wide portion 421 may be variously changed.

Figure 20:
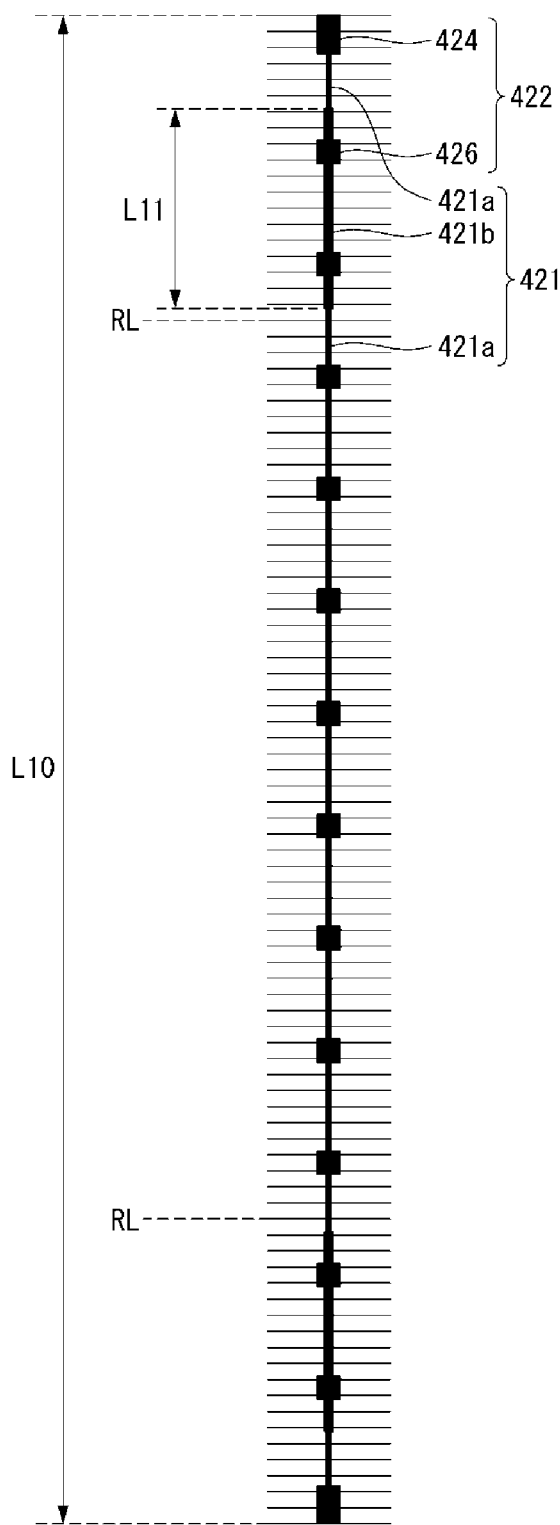
FIG. 20 is a partial plan view of a solar cell according to still another modified embodiment of the invention.

FIG. 20 is a partial plan view of a solar cell according to still another embodiment of the invention. FIG. 20 shows a portion corresponding to the portion shown in FIG. 16, but a lead is omitted for simplicity and clarity.

Referring to FIG. 20, in the embodiment, it is exemplified that a wide portion 421b is positioned between an outer pad 424 and an imaginary reference line RL, but is spaced apart from the outer pad 424. In this instance, a main line portion 421 may be positioned between the outer pad 424 and the wide portion 421b to connect them. That is, it is sufficient that the wide portion 421b is positioned between the outer pad 424 and the imaginary reference line RL, and thus, the wide portion 421b may be not in contact with the outer pad 424. Various other modifications are possible. A length L11 of the wide portion 421b (a distance between one end of the wide portion 421b and the other end of the wide portion 421b) may be the same as or greater than a length between the outer pad 424 and the inner pad 426 adjacent thereto or a length between two adjacent inner pads 426. Alternatively, the length L11 of the wide portion 421b may be the same as or greater than a length L12 of the outer pad 424. However, the embodiments of the invention are not limited thereto.

In the drawings and the above description, the first electrode 42 is shown and described as an example. Similarly, a second electrode 44 may include a plurality of pad portions including an inner pad and an outer pad, and a line portion including a main line portion and a wide portion. The descriptions of the inner pad 426, the outer pad 424, the pad portion 422, the main line portion 421a, the wide portion 421b, and the line portion 421 of the first electrode 42 may be applied to the inner pad, the outer pad, the pad portion, the main line portion, the wide portion, and the line portion of the second electrode 44, respectively, as they are. In this instance, the position, the width, the shape, or the like of the wide portion 421b of the first electrode 42 may be the same as or different from a position, a width, a shape, or the like of the wide portion of the second electrode 44, respectively.

In the drawings and the above descriptions, it is exemplified that the plurality of bus bars 42b have the same shape. Then, the wide portion 421b is formed at each of the bus bars 42b, and the wide portions 421b at the bus bars 42b have a uniform width and length and uniformly positioned. As a result, an effect of the wide portion 421b can be maximized and a stability of the solar cell 150 can be improved. However, the embodiments of the invention are not limited thereto. Therefore, the wide portion 421b may be formed only at a part of the plurality of bus bars 42b (for example, at least one bus bar 42b), and the wide portion 421b may not be formed at the other bus bar 42b. Also, widths, lengths, or positions of the wide portions 421b at the plurality of bus bars 42b may be different from each other. In the drawings and the above descriptions, it is exemplified that the wide portions 421b at both sides of the bus bar 42b have a symmetrical shape. However, embodiments of the invention are not limited thereto. Thus, the wide portion 421b may be formed only at one side of the bus bar 42b, or widths, lengths, or positions of the wide portions 421b positioned at both sides of the bus bar 42b may be different from each other.

Figure 21:
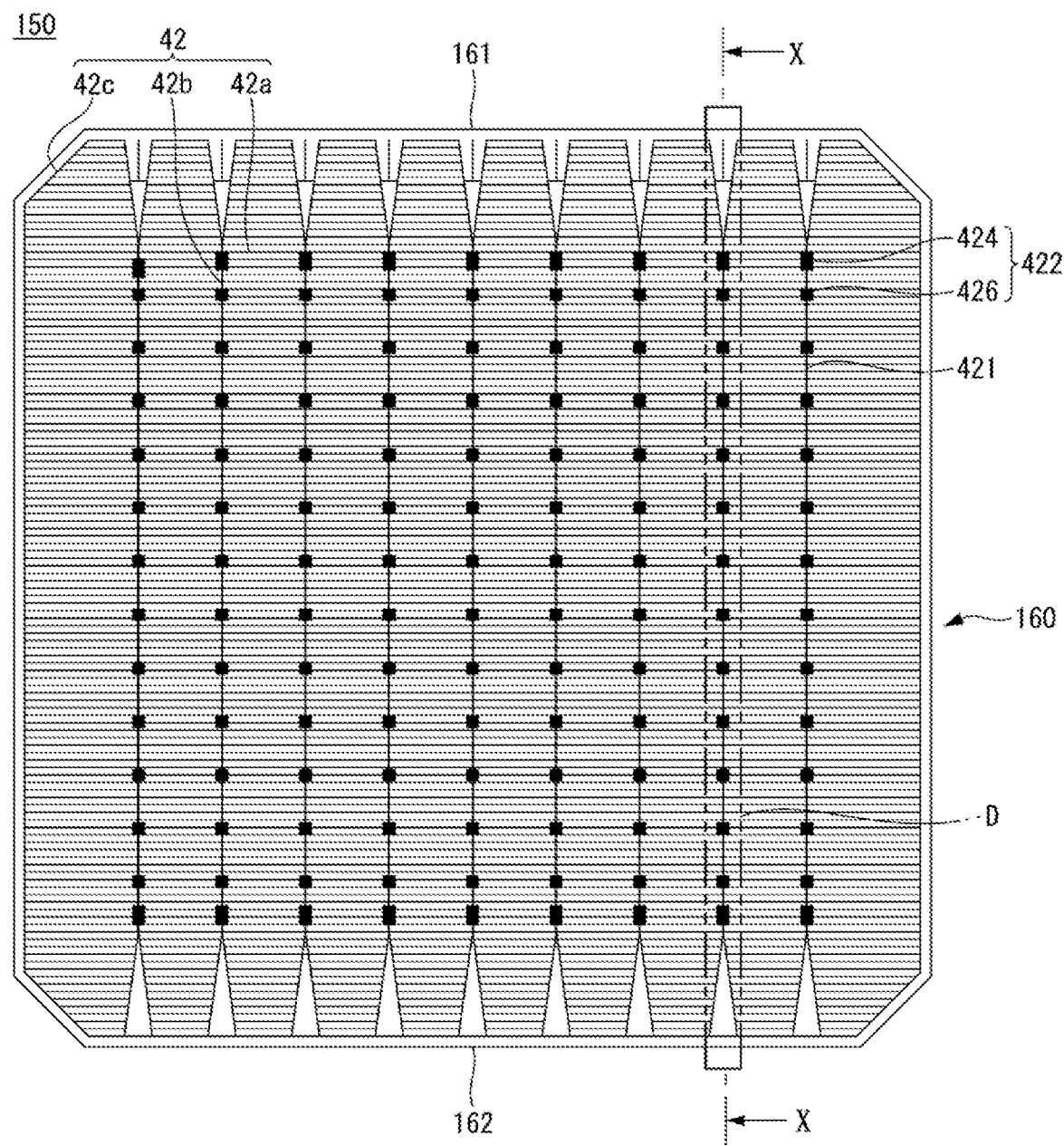
FIG. 21 is a front plan view of a solar cell according to still another modified embodiment of the invention.
Figure 22:
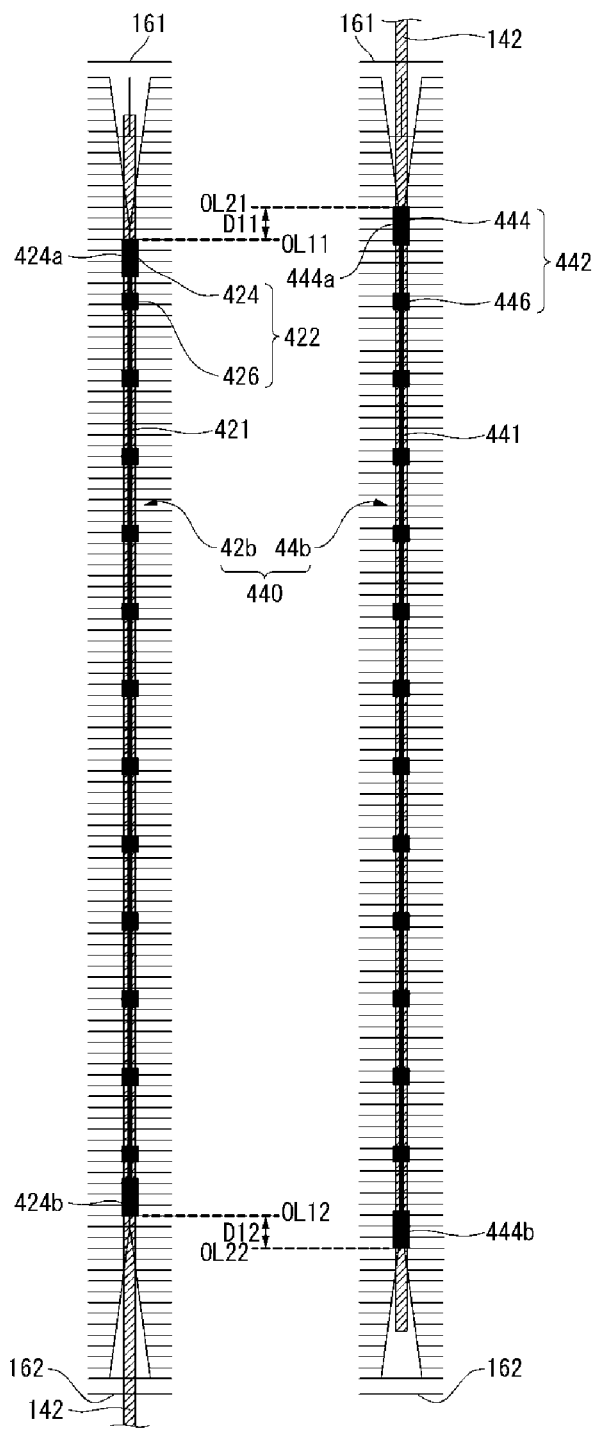
FIG. 22 shows a partial front plan view for showing a state in which a lead is attached to the solar cell shown in portion D of FIG. 21.
Figure 23:
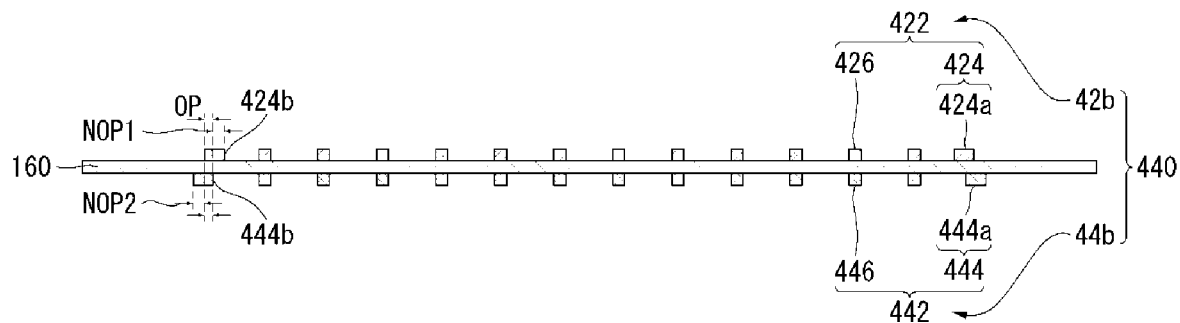
FIG. 23 is a schematic cross-sectional view of the solar cell taken along line X-X in FIG. 21.

FIG. 21 is a front plan view of a solar cell according to still another embodiment of the invention. FIG. 22 shows a partial front plan view for showing a state that a lead is attached to the solar cell in portion D of FIG. 21 in (a) and shows a partial rear plan view for showing the state that the lead is attached to the solar cell in portion D of FIG. 21 in (b). FIG. 23 is a schematic cross-sectional view of the solar cell taken along line X-X in FIG. 21. A semiconductor substrate 160 and pad portions 422 and 442 are only shown in FIG. 23 for simplicity and clarity.

Referring to FIGS. 21 to 23, in the embodiment, a first electrode 42 positioned on a surface of a semiconductor substrate 160 may include a plurality of first finger lines 42a and a first bus bar 42b. The first finger lines 42a extend in a first direction (a horizontal direction in the drawing) and are parallel to each other. The first bus bar 42b is formed in a second direction (a longitudinal direction in the drawing) crossing (for example, perpendicular to) the first finger lines 42a and electrically connected to the first fingers line 42a. A lead 142 is connected or attached to the first bus bar 42b. In the drawing, it is exemplified that the first electrode 42 includes a first edge line 42c and first electrode portions 42d and 42e.

Similarly, in the embodiment, a second electrode 44 positioned on the other surface of the semiconductor substrate 160 includes a second bus bar 42a positioned in the second direction at a position corresponding to the first bus bar 42b. The second electrode 44 may include a plurality of second finger lines 44a, a second edge line (not shown) corresponding to the first edge line 42c of the first electrode 42, and/or second electrode portions (not shown) corresponding to the first electrode portions 42d and 42e of the first electrode 42. It is sufficient that the second electrode 44 includes the second bus bar 44b, and thus, the second electrode 44 may not include the second finger line 44a, the second edge line, and/or the second electrode portions.

In this instance, the first bus bar 42b includes a plurality of first pad portions 422 positioned in a second direction to correspond to the lead 142. The first bus bar 42b may further include a first line portion 421 having a width smaller than that of the first pad portion 422 and longitudinally extending in a direction, in which the lead 142 extends, between the first pad portions 422 to connect the first pad portions 422. The plurality of first pad portions 422 may include a first outer pad 424 positioned at a portion adjacent to an end of the first bus bar 42b in the second direction and a first inner pad 426 other than the first outer pad 424. The first outer pad 424 may include a first one-end outer pad 424a and a first other-end outer pad 424b, each positioned closest to first and second sides 161 and 162 of the solar cell 150 (or the semiconductor substrate 160) among the plurality of first pad portions 422 when viewed in the second direction. The first inner pad 424 may be a pad or pads between two outer pads 424. In this instance, the first outer pad 424 and the first inner pad 426 may be discriminated only considering the plurality of the first pad portions 422.

The second bus bar 44b includes a plurality of second pad portions 442 including a second outer pad 444 and a second inner pad 446. The second outer pads 424 may include a second one-end outer pad 444a and a second other-end outer pad 444b, each positioned closest to the first and second sides 161 and 162 of the solar cell 150. The second bus bar 44b may further include a second line portion 441.

The descriptions of the first finger line 42a, the first bus bar 42b (that is, the first pad portions 422, which includes the first inner pads 426 and the first outer pads 424 having the first one-end outer pad 424a and the first other-end outer pad 424b and the first inner pads 426, and the first line portion 421), the first edge line 42c, and the first electrode portions 42d and 42e of the first electrode 42 may be applied to the second finger line 44a, the second bus bar 44b (that is, the second pad portions 442, which includes the second inner pads 446 and the second outer pads 444 having the second one-end outer pad 444a and the second other-end outer pad 444b and the second inner pads 446, and the second line portion 441), the second edge line, and the second electrode portions of the second electrode 44, respectively, as they are.

A number of the first bus bar 42b may be the same as a number of the second bus bar 44b. The first and second finger lines 42a and 44a may have the same width, the same pitch, and the same number. However, the embodiments of the invention are not limited thereto. At least one of a width, a pitch, and a number of the first finger lines 42a may be different from that of the second finger lines 44a.

In the embodiment, in a pair of bus bars 440 (that is, the first bus bar 42b and the second bus bar 44b corresponding to each other), the first outer pad 424 and the second outer pad 444 adjacent to the same edge (i.e., the first or second side 161 or 162) of the semiconductor substrate 160 are positioned at different positions. For example, positions of outer edges OL11 and OL12 of the first outer pads 424 are different from positions of outer edges OL21 and OL22 of the second outer pads 444 at the first or second edge 161 or 162 of the semiconductor substrate 160 in the second direction.

The first and second outer pads 424 and 444 are positioned near the edges of the semiconductor substrate 160 and are the last portions to which the lead 142 is substantially attached. Thus, the outer edges OL11 and OL12 of the first outer pads 424 and the outer edges OL21 and OL22 of the second outer pads 444 may constitute boundaries between a portion where the lead 142 is attached to the first and second bus bars 42b and 44b and a portion where the lead 142 is not attached to the first and second bus bars 42b and 44b. As a result, whether the lead 142 is attached or not is determined based on the outer edges OL11 and OL12 of the first outer pads and the outer edges OL21 and OL22 of the second outer pads 444. Thus, a thermal stress may occur at the boundaries between the two portions. The thermal stress may occur in an attaching process of the lead 141, in at a temperature cycling test (TC), or due to a temperature change during the solar cell panel 100 is operated. Particularly, in the portion adjacent to the first and second outer pads 424 and 444, the lead 142 has a bent portion where the lead 142 is bent for connection with another solar cell 150. A force may be applied to the bent portion of the lead 142 in a direction away from the solar cell 150, and therefore, the problem caused by the thermal stress may be largely induced at the portion adjacent to the first and second outer pads 424 and 444.

In view of this, in the embodiment, the positions of the first and second outer pads 424 and 444 (more specifically, the positions of the outer edges OL11 and OL12 of the first outer pads 424 and the outer edges OL21 and OL22 of the second outer pads 444) may be different from each other. Then, the boundaries are dispersed, and therefore, the thermal stress can be reduced and dispersed. Particularly, in the embodiment, when the lead 142 having a small width and including a rounded portion is applied, lots of the lead 142 are provided, and numbers of the first and second outer pads 424 and 444 are increased. Thus, the thermal stress may be concentrated and intensified. Therefore, when the positions of the first and second outer pads 424 and 444 are different in the structure in which the lead 142 having the small width is used, the effect of reducing the thermal stress can be further enhanced. For reference, in the conventional art having a bus bar electrode of a wide width, a position between the bus bar electrode and a ribbon may be adjusted by adjusting a flux position when the ribbon was attached. However, in the embodiment, the position of the lead 142 and the first and second outer pads 424 and 444 may be difficult to be adjusted by adjusting the flux position because an attaching area of the lead 142 is relatively small.

On the other hand, unlike in the embodiment, if first and second outer pads corresponding to each other are formed at the same positions and the first and second outer pads and a lead have boundaries at the same positions, a thermal stress is concentrated at a portions adjacent to the first and second outer pads, and a crack or the like may occur in the solar cell, thereby decreasing a reliability of a solar cell panel.

As described above, the first outer pad 424 includes the first one-end outer pad 424a and the first other-end outer pad 424b, and the second outer pad 444 includes the second one-end outer pad 444a and the second other-end outer pad 444b. In this instance, the outer edge OL11 of the first one-end outer pad 424a and the outer edge OL21 of the second one-end outer pad 444a adjacent to the first side 161 of the semiconductor substrate 160 may be located at different positions, and/or the outer edge OL12 of the first other-end outer pad 424b and the outer edge OL22 of the second other-end outer pad 444b adjacent to the second side 162 of the semiconductor substrate 160 may be located at different positions. In the embodiment, it is exemplified that the outer edges OL11 and OL12 of the first and second one-end outer pads 424a and 444a are located at different positions from each other and the outer edges OL21 and OL22 of the first and second other-end outer pads 424b and 444b are located at different positions from each other. Then, the attachment positions of the leads 142 at the both surfaces of the first and second bus bars 42b and 44b constituting the pair of bus bars 440 are different from each other, and thus, the effect of reducing and dispersing the thermal stress can be maximized.

In the embodiment, the first one-end outer pad 424a and the second one-end outer pad 444a may be positioned to be symmetrical to each other, and the first other-end outer pad 424b and the second other-end outer pad 444b may be symmetrical to each other. Thus, a relationship between the first one-end outer pad 424a and the second one-end outer pad 444a and a relationship between the first other-end outer pad 424b and the second other-end outer pad 444b may be the same. Accordingly, hereinafter, the first one-end outer pad 424a and the second one-end outer pad 444a or the first other-end outer pad 424b and the second other-end outer pad 444b will be described as the first outer pad 424 and the second outer pad 444. Therefore, except that there are different descriptions or that the first one-end outer pad 424a, the second one-end outer pad 444a, the first other-end outer pad 424b, the second other-end outer pad 444b, etc. are specified stated, the descriptions of the first outer pad 424 and the second outer pad 444 may be applied to the first one-end outer pad 424a and the second one-end outer pad 444a or the first other-end outer pad 424b and the second other-end outer pad 444b as they are.

More specifically, in order to electrically connect two adjacent solar cells 150, the leads 142 at both surfaces of the solar cell 150 or the semiconductor substrate 160 may be positioned at the same position in the first direction. The first and second outer pads 424 and 444 on both surfaces of the semiconductor substrate 160 have center lines at the same positions in the first direction and are positioned at the same position in the first direction. On the other hand, in the second direction, the outer edge OL11 or OL12 of the first outer pad 424 and the outer edge OL21 or OL22 of the second outer pad 444 at both surfaces of the semiconductor substrate 160 may be located at different positions.

In the embodiment, the first and second outer pads 424 and 444 may have non-overlapped portions NOP1 and NOP2, respectively, which do not overlap with each other in the second direction. Then, the position of the first outer pad 424 attached to the lead 142 and the position of the second outer pad 444 attached to the lead 142 are different from by an amount correspond to the non-overlapped portions NOP1 and NOP2, and thus, the thermal stress can be reduced and dispersed.

As one example, in one embodiment, the first outer pad 424 and the second outer pad 444 may partially overlap to form an overlapping portion OP in the second direction, the first non-overlapping portion NOP1 may be provided on one end of the first outer pad 424, and the second non-overlapping portion NOP2 may be provided on the other end of the second outer pad 444. Since the first outer pad 424 and the second outer pad 444 have the substantially same length in the second direction, the first non-overlapping portion NOP1 and the second non-overlapping portion NOP2 are symmetrical with respect to each other while interposing the overlapping portion OP. In this instance, the term of "the substantially same length" means that a difference between a first length of the first outer pad 424 and a second length of the second outer pad 444 is within 10% of the length of the first outer pad 424 or the length of the second outer pad 444. When the first outer pad 424 and the second outer pad 444 have the substantially same length, an adhesion property between the lead 142 and the first outer pad 424 and an adhesion property between the lead and the second outer pad 444 may be uniform. However, the embodiments of the invention are not limited thereto. Thus, the length of the first outer pad 424 may be different from the length of the second outer pad 444.

In this instance, each of distances D11 and D12 between the outer edges OL11 and OL12 of the first outer pads 424 and the outer edges OL21 and OL22 of the second outer pads 444 may be in a range of 0.5 mm to 15 mm. For example, a first distance D11 between the outer edge OL11 of the first one-end outer pad 424a and the outer edge OL21 of the second one-end outer pad 444a may be in a range of 0.5 mm to 15 mm, and a second distance D12 between the outer edge OL12 of the first other-end outer pad 424b and the outer edge OL22 of the second other-end outer pad 444a may be in a range of 0.5 mm to 15 mm. If the distance D11 or D12 may be less than 0.5 mm, the effect of dispersing and reducing thermal stress may not be sufficient. If the distance D11 or D12 may exceed 15 mm, a length of the lead 142 attached to one of the first and second bus bars 42b and 44b may be reduced and thus carrier may not be smoothly transferred to the lead 142. Similarly, each of distances between inner edges of the first outer pad 424 and inner edges of the second outer pad 444 may be in a range of 0.5 mm to 15 mm. However, the embodiments of the invention are not limited thereto.

In the embodiment, the first outer pad 424 on the front surface of the solar cell 150 may be inwardly positioned than the second outer pad 444 on the back surface of the solar cell 150. In this instance, the phrase "one pad is inwardly positioned than the other pad" means that a distance between the one pad and the first or second side 161 or 162 where the one pad and the other pad are adjacent is greater than a distance between the other pad and the first or second side 161 or 162 where the one pad and the other pad are adjacent. For reference, an end of the lead 142 is positioned near the first side 161 and the lead 142 passes the second side 162 and extends to another solar cell 150 on the front surface of the semiconductor substrate 160, while the lead 142 passes the first side 161 and extends to other solar cell 150 and an end of the lead 142 is positioned near the second side 162 on the back surface of the semiconductor substrate 160.

More specifically, in the second direction, the first one-end outer pad 424a may be inwardly positioned than the second one-end outer pad 444a, and the first other-end outer pad 424b may be inwardly positioned than the second other-end outer pad 444b.

If the lead 142 is peeled off from the first one-end outer pad 424a where the end of the lead 142 is located on the front surface of the semiconductor substrate 160 where the pn junction is located, a loss of carriers may be increased. Considering this, the first outer pad 424a may be spaced apart from the first side 161 of the semiconductor substrate 160 by a predetermined distance. In this instance, if the second one-end outer pad 444a is inwardly positioned than the first one-end outer pad 424a, the second one-end outer pad 444a may be excessively spaced apart from the first side 161 of the semiconductor substrate 160, and thus, there may be a portion that does not collect carriers. Thus, the second one-end outer pad 444a may be outwardly positioned that the first one-end outer pads 424a. Also, the first other-end outer pad 424b at a side where the lead 142 is connected to the other solar cell 150 may be inwardly positioned than the second other-end outer pad 444b in order to reduce the force applied to the lead 142 in a direction away from the solar cell 150.

As one example, the first one-end outer pad 424a and the first other-end outer pad 424b may be symmetrical to a center line (a line crossing a center in the second direction and extending in a direction crossing the second direction) of the solar cell 150, and the second one-end outer pad 444a and the second other-end outer pad 444b may be symmetrical to the center line of the solar cell 150. As a result, a current flow can be stably realized, and a device used for the conventional symmetric structure can be used as it is.

In the embodiment, the first inner pad 426 and the second inner pad 446 may overlap each other. For example, center lines of the plurality of first inner pads 426 and the plurality of second inner pads 446 may coincide with each other in the first and second directions. For example, the plurality of first inner pads 426 and the plurality of second inner pads 446 may be positioned at the same positions and with the same shapes. Since the first and second inner pads 426 and 446 are not located at the boundary with the lead 142, the thermal stress may not be a significant even if they are located at the same positions. When the first and second inner pads 426 and 446 may overlap with each other, a movement path of carriers can be uniform. However, the first inner pad 426 and the second inner pad 446 may include a position where they do not overlap with each other in the second direction, and this is also within the scope of the embodiments of the invention.

In the embodiment, the pair of bus bars 440 (that is, the first bus bar 42b and the second bus bar 42b), which are positioned at opposite surfaces of the semiconductor substrate 160 or the solar cell 150, are provided in plural in the first direction. The plurality of the pair of bus bars 440 may be spaced apart from each other in the first direction. In one embodiment, it is exemplified that an arrangement of the first outer pad 424 and the second outer pad 426 in every pair of bus bars 440 is the same. Accordingly, the positions of all of the first outer pads 424 and the second outer pads 444 located in all the pair of bus bars 440 may be different from each other, and then, a thermal stress can be effectively reduced and dispersed. However, the embodiments of the invention are not limited thereto this. Another example will be described later in more detail with reference to FIG. 28.

In the solar cell 150 and the solar cell panel 100 including the same, a light loss can be minimized by the bus bar 42b having a small width and/or the lead 142 having a wire shape, and a movement path of the carriers can be reduced by increasing a number of bus bars 42b and/or the leads 142. Thus, an efficiency of the solar cell 150 and an output of the solar cell panel 100 can be enhanced.

In this instance, by differentiating positions of the first and second outer pads 424 and 444 corresponding to or adjacent to each other on both surfaces of the solar cell 150, boundaries with the leads 142 can be dispersed and a thermal stress can be reduced and dispersed. Particularly, the effect of reducing and dispersing the thermal stress can be further enhanced when a large number of the leads 142 are used as in the embodiment. Thus, a crack of the solar cell 150 due to the thermal stress can be prevented and a reliability of the solar cell panel 100 can be improved.

Figure 24:
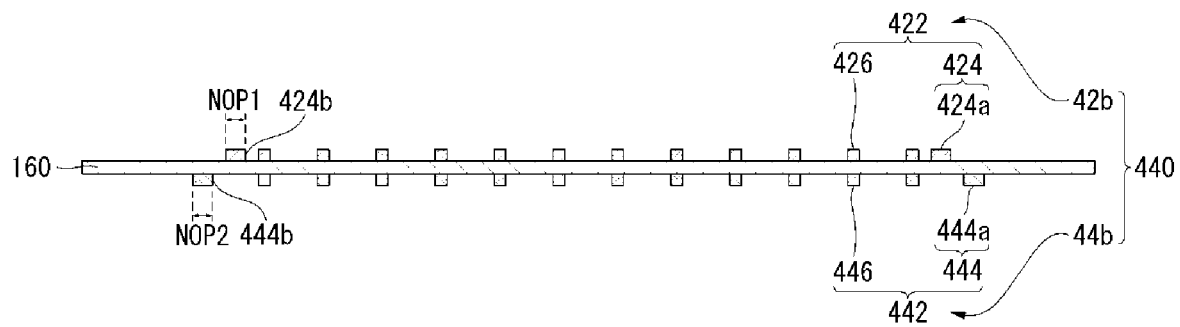
FIG. 24 is a schematic cross-sectional view of a solar cell according to still another modified embodiment of the invention.

FIG. 24 is a schematic cross-sectional view of a solar cell according to still another modified embodiment of the invention. A semiconductor substrate and pad portions are only shown in FIG. 24 for simplicity and clarity.

Referring to FIG. 24, in the embodiment, first and second outer pads 424 and 444 do not overlap with each other, and thus, the first outer pad 424 is entirely formed of a first non-overlapped portion NOP1 and the second outside pad 444 is entirely formed of a second non-overlapped portion NOP2. Accordingly, the first and second outer pads 424 and 444 are located at different positions which do not overlap at all, and thus, a thermal stress can be effectively reduced and dispersed.

Figure 25:
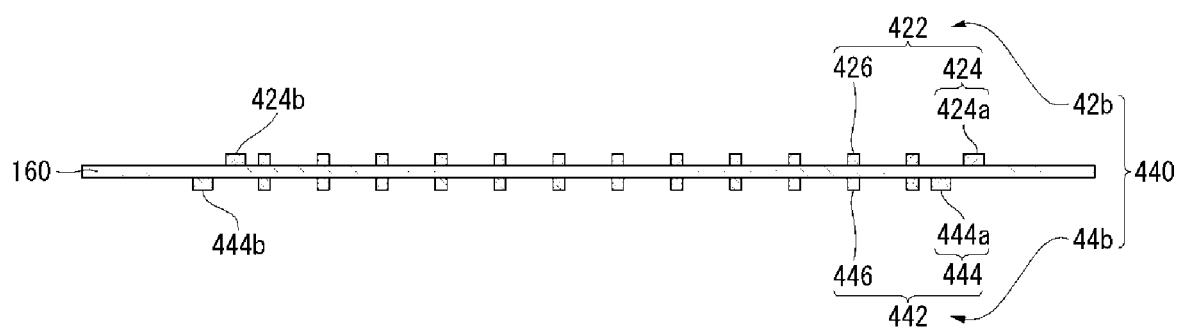
FIG. 25 is a schematic cross-sectional view of a solar cell according to still another modified embodiment of the invention.

FIG. 25 is a schematic cross-sectional view of a solar cell according to still another modified embodiment of the invention. A semiconductor substrate and pad portions are only shown in FIG. 25 for simplicity and clarity.

Referring to FIG. 25, in the embodiment, a first one-end outer pad 424a may be inwardly positioned than a second one-end outer pad 444a, and a first other-end outer pad 424b may be outwardly positioned than a second other-end outer pad 444b. The second one-end outer pad 444a and the first other-end outer pad 424b are located at portions where the lead 142 is connected to the other solar cell 150, and thus, the forces applied to them are large. By inwardly positioning the second one-end outer pad 444a and the first other-end outer pad 424b than the first one-end outer pad 424a and the second other-end outer pad 444b, respectively, the force applied to the lead 142 can be minimized. Accordingly, the first one-end and other-end outer pads 424a and 424b may biased to one side with respect to the second one-end and other-end outer pads 444a and 444b in the second direction, respectively.

It is exemplified that the first outer pads 424 and the second outer pads 444 are separated from each other in FIG. 25. However, the first outer pads 424 and the second outer pads 444 may overlap with each other as shown in FIG. 23, Also, as opposed to FIG. 25, the first one-end outer pad 424a may be inwardly positioned than the second one-end outer pad 444a and the first other-end outer pad 424b may be outwardly positioned than the second other-end outer pad 444b.

Figure 26:
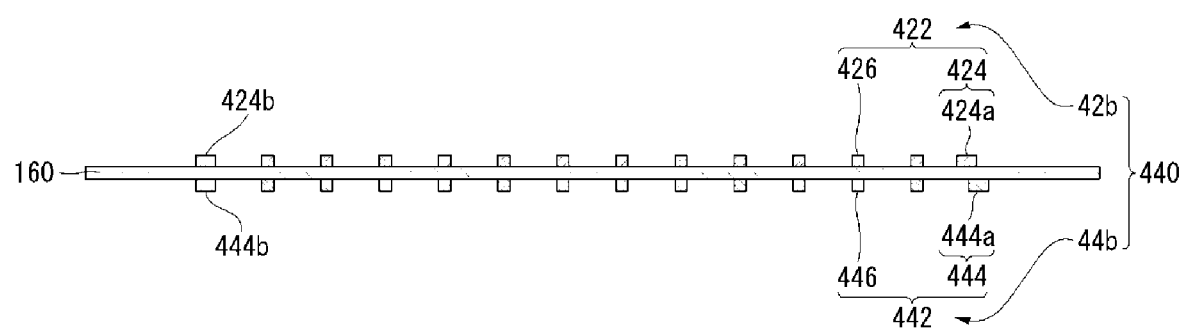
FIG. 26 is a schematic cross-sectional view of a solar cell according to still another modified embodiment of the invention.

FIG. 26 is a schematic cross-sectional view of a solar cell according to still another modified embodiment of the invention. A semiconductor substrate and pad portions are only shown in FIG. 26 for simplicity and clarity.

Referring to FIG. 26, in the embodiment, a first one-end outer pad 424a and a second one-end outer pad 444a may be located at different positions in a second direction, and a first other-end outer pad 424b and a second other-end outer pad 444b may be located at the same position (for example, to have the same outer edges).

Although it is exemplified that the first one-end outer pad 424a and the second one-end outer pad 444a have an arrangement as shown in FIG. 23 in the drawing, the embodiments of the invention are not limited thereto. Accordingly, the first one-end outer pad 424a and the second one-end outer pad 444a may have an arrangement as shown in FIG. 24 or 25. Although it is exemplified that the first and second one-end outer pads 424a and 444a are located at different positions in the drawing, the embodiment of the invention are not limited thereto. Accordingly, the first one-end outer pad 424a and the second one-end outer pad 444a may be located at the same position, and the first other-end outer pad 424b and the second other-end outer pad 444b may be located at different positions.

Figure 27:
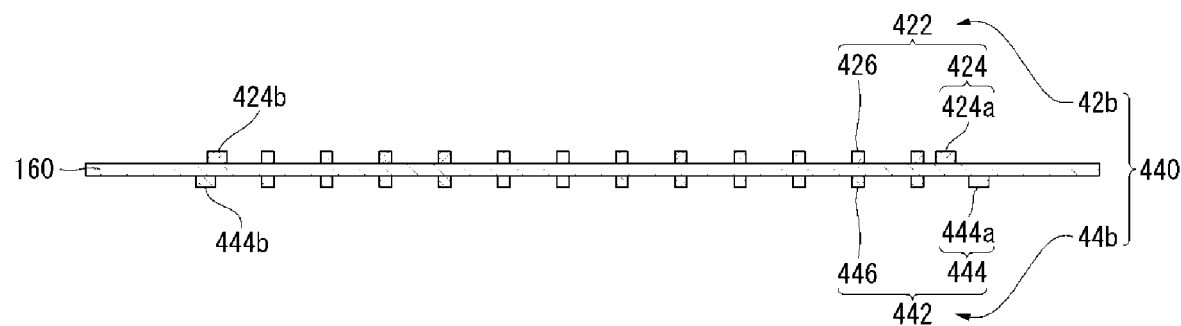
FIG. 27 is a schematic cross-sectional view of a solar cell according to still another modified embodiment of the invention.

FIG. 27 is a schematic cross-sectional view of a solar cell according to still another modified embodiment of the invention. A semiconductor substrate and pad portions are only shown in FIG. 27 for simplicity and clarity.

Referring to FIG. 27, a first one-end outer pad 424a and a second one-end outer pad 444a may be located at different positions, a first other-end outer pad 424b and a second other-end outer pad 444b may be located at different positions, an arrangements between the first and second one-end outer pads 424a and 444a and the first and second other-end outer pads 424b and 444b may be different from each other. In this instance, the phrase of "arrangements between the first and second one-end outer pads 424a and 444a and the first and second other-end outer pads 424b and 444b are different" may include an instance in which lengths of the first and second one-end outer pads 424a and 444a and the first and second other-end outer pads 424b and 444b are different from each other, an instance in which lengths of overlapped portions and/or non-overlapped portions of the first and second one-end outer pads 424a and 444a and the first and second other-end outer pads 424b and 444b are different, or the like.

Figure 28:
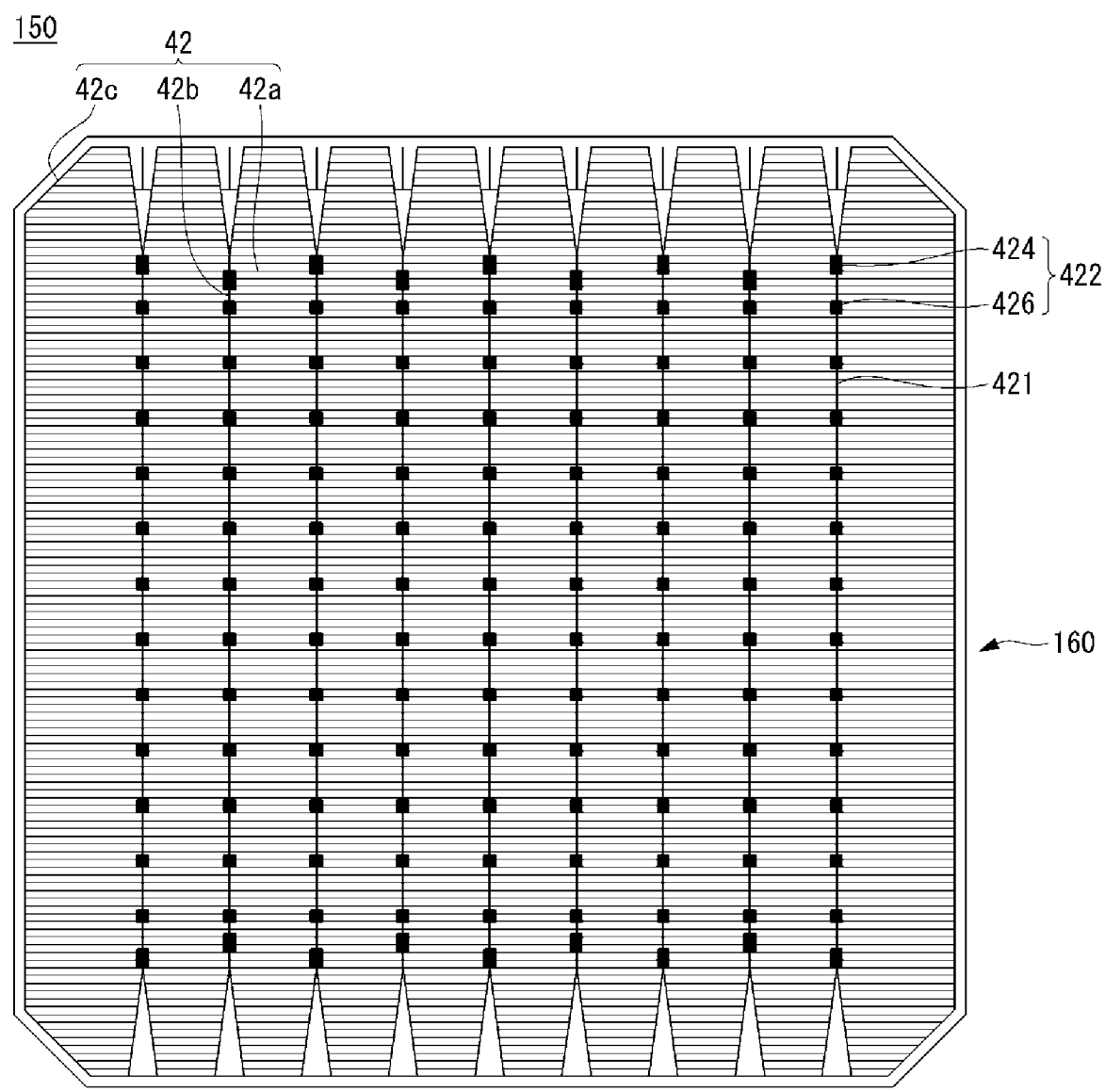
FIG. 28 is a front plan view of a solar cell according to still another modified embodiment of the invention.

FIG. 28 is a front plan view of a solar cell according to still another modified embodiment of the invention.

In the embodiment, when a plurality of a pair of bus bars 440 (refer to FIG. 22) are provided on a semiconductor substrate 160 or a solar cell 150, one pair of bus bars 440 and other pair of bus bars 440 may be different from each other in an arrangement of a plurality of first pad portions 422 and a plurality of second pad portions 444. That is, one pair of bus bars 440 and other pair of bus bars 440 may be different from each other in an arrangement of first outer pads 424 and second outer pads 444, and/or one pair of bus bars 440 and other pair of bus bars 440 may be different from each other in an arrangement of first inner pads 426 and second inner pads 446.

Also, an arrangement of the first outer pads 424 in the plurality of first bus bars 42b may be different from each other, and/or an arrangement of the first outer pads 444 in the plurality of second bus bars 44b may be different from each other. In FIG. 28, it is exemplified that some of the first outer pads 424 of the first bus bar 42b are inwardly positioned and the other of the first outer pads 424 of the first bus bar 42b are outwardly positioned as an example. However, the embodiments of the invention are not limited thereto. Similarly, an arrangement of the first inner pads 426 in the plurality of first bus bars 42b may be different from each other, and/or an arrangement of the second inner pads 446 in the plurality of second bus bars 44b may be different from each other.

That is, the first and second outer pads 424 and 444 and/or the first and second inner pads 426 and 446 may be different from each other in the plurality of first bus bars 42b and the plurality of second bus bars 44b. Then, the arrangement of the first and second outer pads 424 and 444 and/or the first and second inner pads 426 and 446 may be different from each other in one pair of bus bars 440 among the plurality of pair of bus bars 400.

In FIGS. 15 to 28, it is exemplified that a plurality of pad portions 422 have a uniform arrangement. However, the embodiments of the invention are not limited thereto. Therefore, any of the bus bar 42b having regions, which are different from each other in an arrangement and an area of the plurality of pad portions 42, as described with reference to FIGS. 1 to 14, may be applied to any of the embodiments with reference to FIGS. 15 to 28, which also falls within the scope of the embodiments of the invention. Also, any of the line portion 421 described with reference to FIGS. 15 to 20, each having the main line portion 421a and the wide portion 421b, may be applied to the line portion 421 of any of the embodiments with reference to FIGS. 1 to 12, and 21 to 28, which also falls within the scope of the embodiments of the invention.

Hereinafter, the embodiments of the invention will be described in more detail with reference to experimental examples of the invention. However, the experimental examples of the invention are only for exemplifying the embodiments of the invention, and thus, the embodiments of the invention are not limited thereto.

Embodiment 1

A plurality of solar cells having an electrode structure as shown in FIG. 15 were manufactured. In this instance, a semiconductor substrate included a single crystal silicon substrate having an n-type as a base region, a first conductive region formed of a doped region having a p-type, and a second conductive region formed of a doped region having an n-type. In this instance, a line portion of a bus bar included a main line portion and wide portions, each extending from an outer pad and connected to the main line portion via two inner pads. These solar cells were electrically connected using leads and thus a solar panel was manufactured.

Embodiment 2

A solar cell panel was manufactured similarly to Embodiment 1 except that a line portion of a bus bar included a main line portion and wide portions, each extending from an outer pad and connected to the main line portion via one inner pad.

Figure 29:
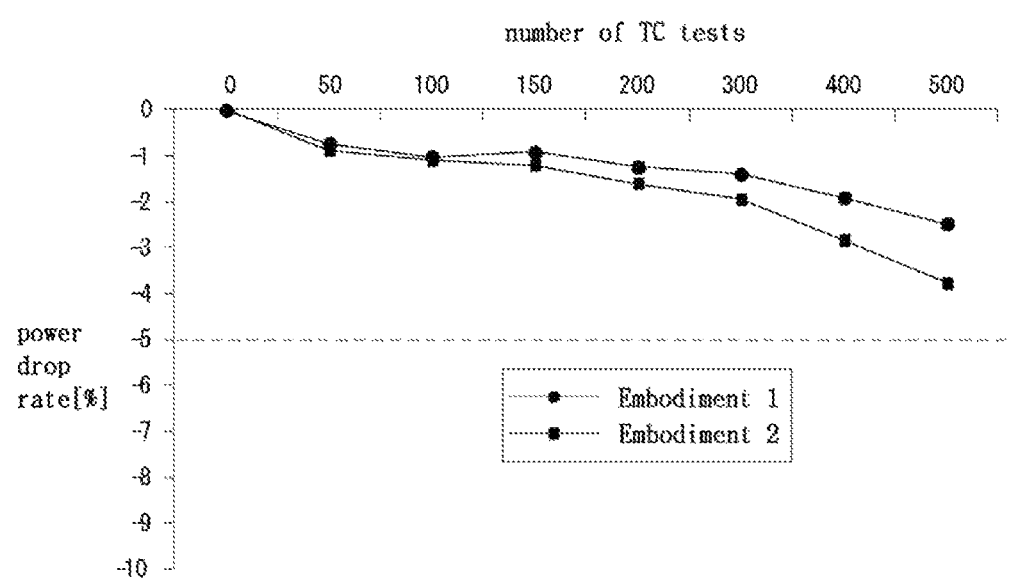
FIG. 29 is a graph for showing a power drop rate of solar cell panels according to Embodiment 1 and Embodiment 2 after a thermal cycling (TC) test.

Based on Embodiments 1 and 2, a power drop rate was measured after a thermal cycling (TC) test was performed to the solar cell panels according to each of Embodiment 1 and Embodiment 2, and the results are shown in FIG. 29. Referring to FIG. 29, it can be seen that the power drop rates of the solar cell panels according to Embodiments 1 and 2 do not significantly decrease even when the thermal cycling tests were performed a large number of times, and the solar cell panels according to Embodiments 1 and 2 have excellent power drop ratios within 5%. Particularly, it can be seen that the power drop ratio of Embodiment 1 where a length of the line portion is relatively long is smaller than the power drop ratio of Embodiment 2.

Thus, it can be seen that adhesion property of the leads hardly deteriorates even in the thermal cycling test under harsh conditions.

The above described features, configurations, effects, and the like are included in at least one of the embodiments of the invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A solar cell, comprising:
a semiconductor substrate;
a conductive region on or at the semiconductor substrate; and
an electrode electrically connected to the conductive region,
wherein the electrode comprises a plurality of finger lines formed in a first direction and parallel to each other, and a bus bar electrically connected to the plurality of finger lines and formed in a second direction crossing the first direction,
wherein the bus bar comprises a plurality of pad portions positioned in the second direction,
wherein the plurality of pad portions comprise a first outer pad positioned at one outermost region among the plurality of pad portions and a second outer pad positioned at another outermost region among the plurality of pad portions, and a plurality of inner pads between the first outer pad and the second outer pad,
wherein the plurality of inner pads are divided into a first group positioned adjacent to the first outer pad at a first region, a second group positioned adjacent to the second outer pad at another first region, and a third group positioned between the first group and the second group at a second region,
wherein the plurality of inner pads comprise a plurality of first pads positioned in the first group and the second group respectively, and a plurality of second pads positioned in the third group,
wherein an area of the first or second outer pad is greater than an area of each of the plurality of inner pads,
wherein all of a width and a length of the plurality of inner pads is equal to each other,
wherein all of neighboring two first pads among the plurality of first pads have a first pitch and all of neighboring two second pads among the plurality of second pads have a second pitch greater than the first pitch,
wherein a third pitch between the first outer pad and a neighboring first pad among the plurality of first pads and a fourth pitch between the second outer pad and a neighboring first pad among the plurality of first pads are equal to each other and are greater than the first pitch,
wherein each of a length in the second direction of the first region and the another first region is smaller than a length in the second direction of the second region, and
wherein each of a number of the plurality of first pads in the first group and the second group is smaller than a number of the plurality of second pads in the third group.

2. The solar cell of claim 1, wherein the bus bar further comprises a line portion connecting the plurality of pad portions in the second direction, and
wherein the line portion comprises a main line portion having a first width and a wide portion having a width larger than the first width.

3. The solar cell of claim 1, wherein the wide portion of the line portion is positioned at the first group, and
wherein the main line portion of the line portion is positioned at the second group.

4. A solar cell panel, comprising:
a plurality of solar cells comprising at least a first solar cell and a second solar cell adjacent to each other; and
a plurality of leads connecting the first solar cell and the second solar cell, and each lead having a rounded portion,
wherein each of the plurality of solar cells comprises a semiconductor substrate, a conductive region on or at the semiconductor substrate, and an electrode electrically connected to the conductive region,
wherein the electrode comprises a plurality of finger lines formed in a first direction and parallel to each other, and a bus bar electrically connected to the plurality of finger lines and formed in a second direction crossing the first direction,
wherein the bus bar comprises a line portion extending in the second direction and a plurality of pad portions spaced apart from each other and having a width greater than a width of the line portion,
wherein the plurality of pad portions comprise a first outer pad positioned at one outermost region among the plurality of pad portions and a second outer pad positioned at another outermost region among the plurality of pad portions, and a plurality of inner pads between the first outer pad and the second outer pad,
wherein the plurality of inner pads are divided into a first group positioned adjacent to the first outer pad, a second group positioned adjacent to the second outer pad, and a third group positioned between the first group and the second group,
wherein the plurality of inner pads comprise a plurality of first pads positioned in the first group and the second group respectively and a plurality of second pads positioned in the third group,
wherein an area of the first or second outer pad is greater than an area of each of the plurality of inner pads,
wherein all of a width and a length of the plurality of inner pads is equal to each other,
wherein each of lengths of the first outer pad and second outer pad is greater than a length of the plurality of inner pads in the first direction,
wherein all of neighboring two first pads among the plurality of first pads have a first pitch and all of neighboring two second pads among the plurality of second pads have a second pitch greater than the first pitch,
wherein a third pitch between the first outer pad and a neighboring first pad among the plurality of first pads and a fourth pitch between the second outer pad and a neighboring first pad among the plurality of first pads are equal to each other and are greater than the first pitch,
wherein each of a number of the plurality of first pads in the first group and the second group is smaller than a number of the plurality of second pads in the third group,
wherein a number of the plurality of leads in the first direction is six to thirty-three based on a surface of the solar cell,
wherein a width of each of the plurality of leads is in a range of 250 to 500 μm, and
wherein a width of the line portion is the same as or is smaller than the width of each of the plurality of leads, and a width of each of the plurality of pad portions is the same as or is greater than the width of each of the plurality of leads.

5. The solar cell panel of claim 4, wherein the first group is positioned at a first region, the second group is positioned at another first region, and the third group is positioned at a second region, and wherein each of a length in the second direction of the first region and the another first region is greater than a length in the second direction of the second region.

6. The solar cell of claim 1, wherein a number of the plurality of finger lines disposed between two neighboring first pads is smaller than a number of the plurality of finger lines disposed between two neighboring second pads.

7. The solar cell of claim 1, wherein a number of the plurality of finger lines disposed between the first outer pad or the second outer pad and the neighboring first pad is greater than a number of the plurality of finger lines disposed between neighboring two first pads.

8. The solar cell panel of claim 4, wherein a number of the plurality of finger lines disposed between two neighboring first pads is smaller than a number of the plurality of finger lines disposed between two neighboring second pads.

9. The solar cell panel of claim 4, wherein a number of the plurality of finger lines disposed between the first outer pad or the second outer pad and the neighboring first pad is greater than a number of the plurality of finger lines disposed between neighboring two first pads.

* * * * *